United States Patent
Kudo et al.

(10) Patent No.: US 7,928,476 B2
(45) Date of Patent: Apr. 19, 2011

(54) SEMICONDUCTOR DEVICE AND METHOD OF MANUFACTURING THE SAME

(75) Inventors: Hiroshi Kudo, Kawasaki (JP);
Nobuyuki Ohtsuka, Kawasaki (JP);
Masaki Haneda, Kawasaki (JP);
Tamotsu Owada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 139 days.

(21) Appl. No.: 12/274,804

(22) Filed: Nov. 20, 2008

(65) Prior Publication Data
US 2009/0146309 A1 Jun. 11, 2009

(30) Foreign Application Priority Data

Dec. 5, 2007 (JP) ................................ 2007-314729

(51) Int. Cl.
*H01L 23/52* (2006.01)
(52) U.S. Cl. ........ 257/211; 257/374; 257/751; 257/758; 257/E23.141; 257/E21.575
(58) Field of Classification Search .................. 257/211, 257/374, 758, 751, E23.141, E21.575
See application file for complete search history.

(56) References Cited

U.S. PATENT DOCUMENTS

| | | | |
|---|---|---|---|
| 2005/0218519 A1* | 10/2005 | Koike et al. | 257/756 |
| 2006/0003579 A1* | 1/2006 | Sir | 438/639 |
| 2007/0018329 A1 | 1/2007 | Oh et al. | |
| 2007/0045851 A1* | 3/2007 | Kitada et al. | 257/758 |
| 2009/0096102 A1* | 4/2009 | Gambino et al. | 257/751 |
| 2009/0117731 A1* | 5/2009 | Yu et al. | 438/627 |
| 2010/0099254 A1* | 4/2010 | Narushima et al. | 438/668 |

FOREIGN PATENT DOCUMENTS

| | | |
|---|---|---|
| JP | 2004-505447 A | 2/2004 |
| JP | 2005-277390 A | 10/2005 |
| JP | 2007-27769 A | 2/2007 |
| JP | 2007-142236 A | 6/2007 |
| JP | 2007-149813 A | 6/2007 |
| JP | 2007-220738 A | 8/2007 |
| WO | 02/09173 A2 | 1/2002 |

OTHER PUBLICATIONS

Korean Office Action dated Sep. 20, 2010, issued in corresponding Korean Patent Application No. 10-2008-0120989.

* cited by examiner

*Primary Examiner* — Michelle Estrada
(74) *Attorney, Agent, or Firm* — Westerman, Hattori, Daniels & Adrian, LLP

(57) ABSTRACT

A semiconductor device has a first insulating film formed over a semiconductor substrate, a first opening formed in the first insulating film, a first manganese oxide film formed along an inner wall of the first opening, a first copper wiring embedded in the first opening, and a second manganese oxide film formed on the first copper wiring including carbon.

5 Claims, 29 Drawing Sheets

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2007-314729 filed on Dec. 5, 2007, the entire contents of which are incorporated herein by reference.

BACKGROUND

1. Field

An aspect of the embodiments discussed herein is directed to a semiconductor device having a multilayer wiring structure and a method of manufacturing such a semiconductor device.

2. Description of the Related Art

Semiconductor integrated circuits manufactured today each contain vast numbers of semiconductor elements on the common board thereof and employ a multilayer wiring structure to connect such semiconductor elements with each other.

In a multilayer wiring structure, interlayer insulating films, in each of which wiring patterns are embedded to form a wiring layer, are laminated, and via contacts formed inside the interlayer insulating films connect the upper wiring layer and the lower wiring layer.

In particular, in current ultrafine and ultrahigh-speed semiconductor devices, low-dielectric-constant films (so-called low-k films) are used as such interlayer insulating films to reduce the problem of signal delay, for example RC delay, that occurs in a multilayer wiring structure, as well as low-resistance copper (Cu) patterns used as wiring patterns.

In this type of multilayer wiring structure, in which Cu wiring patterns are embedded in interlayer insulating films with a low dielectric constant, it is desirable to pattern the Cu layer by dry etching. A method often used to pattern the Cu layer by dry etching is a so-called damascene or dual damascene process, wherein wiring trenches or via holes are carved through interlayer insulating films in advance. These wiring trenches or via holes are filled with a Cu layer and then unnecessary portions of the Cu layer remaining on the interlayer insulating films are removed by chemical mechanical polishing (CMP).

Any direct contact of a Cu wiring pattern with an interlayer insulating film in this process would cause Cu atoms to diffuse into the interlayer insulating film, thereby leading to short circuits or other defects. These short circuits or other defects are generally avoided by covering the side walls and bottoms of wiring trenches or via holes used to form Cu wiring patterns with conductive diffusion barriers, also known as barrier metal films, and then coating the barrier metal films with a Cu layer. Examples of materials used for such a barrier metal film may include a high-melting-point metal such as tantalum (Ta), titanium (Ti), and tungsten (W) as well as conductive nitrides thereof.

However, in ultrafine and ultrahigh-speed semiconductor device based on current 45-nm technology or newer technologies, the size of wiring trenches or via holes carved through interlayer insulating films is significantly reduced along with miniaturization. To achieve desirable reduction in the resistance of wiring while using such a high-dielectric-constant barrier metal film, it is accordingly necessary that each of barrier metal films covering such ultrafine wiring trenches or via holes is as thin as possible while seamlessly covering the side walls and bottoms of the wiring trenches or via holes.

A technique that has been proposed to address this situation is direct covering of wiring trenches or via holes carved through interlayer insulating films with a copper-manganese alloy layer (Cu—Mn alloy layer). In this technique, Mn atoms contained in a Cu—Mn alloy layer react with Si and oxygen atoms contained in an interlayer insulating film and thus a manganese-silicon oxide layer having a thickness in the range of 2 nm to 3 nm and a composition of $MnSi_xO_y$ is formed inside the Cu—Mn alloy layer as a diffusion barrier film.

However, it is known that in this technique the internally formed manganese-silicon oxide layer contains manganese (Mn) at a too low concentration and thus the adhesion of that layer to a Cu film is problematically weak.

Consequently, another structure of a barrier metal film in which a Cu—Mn alloy layer is combined with a barrier metal film based on a high-melting-point metal such as Ta or Ti has been proposed.

Such a barrier metal structure combining a Cu—Mn alloy layer with a barrier metal film based on a high-melting-point metal such as Ta or Ti provides preferable characteristics with improved resistance to oxidation through the sequence described below.

Recently, use of low-dielectric-constant porous films as a low-dielectric-constant material constituting interlayer insulating films has been proposed to prevent signal delay, for example RC delay. However, unfortunately, such a low-dielectric-constant porous material has a low density and thus is likely to be damaged by plasma during the manufacturing process, and a damaged film often retains moisture on the surface and inside thereof. Accordingly, a barrier metal film formed on such a low-dielectric-constant porous film would be likely to be oxidized by moisture retained inside and this often results in deteriorated characteristics of the barrier metal film and poor adhesion thereof to a Cu wiring layer or a via plug.

On the other hand, the Cu—Mn alloy layer described above contains Mn atoms, and if the layer is used as a seed layer, these Mn atoms react with oxidized portions of a barrier metal film, thereby ensuring characteristics of the barrier metal film necessary for its use as a diffusion barrier and maintaining high adhesion thereof to a Cu wiring layer or a via plug.

Related information may be found in the following patent documents:

Patent Document 1: Japanese Laid-open Patent Publication No. 2007-142236;
Patent Document 2: Japanese Laid-open Patent Publication No. 2005-277390.

SUMMARY

According to an aspect of an embodiment, a semiconductor device has a first insulating film formed over a semiconductor substrate, a first opening formed in the first insulating film, a first manganese oxide film formed along an inner wall of the first opening, a first copper wiring embedded in the first opening, and a second manganese oxide film formed on the first copper wiring containing carbon.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

FIGS. 1A to 1F are diagrams representing the process of forming a Cu wiring pattern.

Figure 1A:
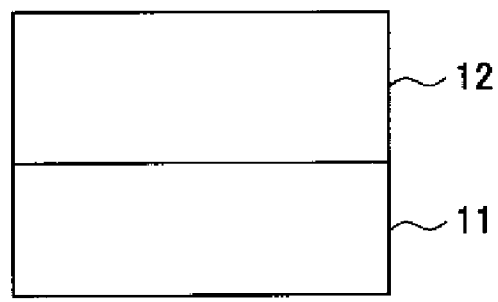
FIGS. 1A-1F are diagrams for explanation of the conventional art.

In FIG. 1A, a silicon dioxide film 12 consisting of a methyl silsesquioxane (MSQ) film covers an insulating film 11 formed on a silicon substrate not shown in the drawing.

Figure 1B:
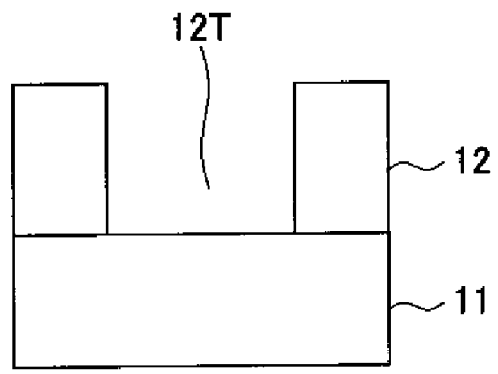

Then, as shown in FIG. 1B, a wiring trench 12T corresponding to a desired wiring pattern is carved through the silicon dioxide film 12.

Figure 1C:
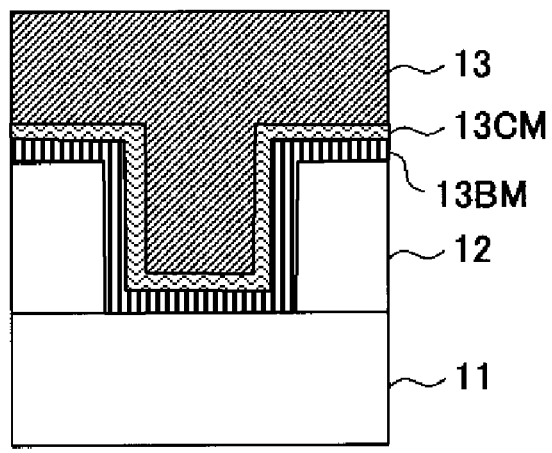

After that, as shown in FIG. 1C, a barrier metal film 13BM consisting of a high-melting-point metal, such as Ta, or a conductive nitride thereof, such as TaN, TiN, or WN, is formed so as to coat the top of the silicon dioxide film 12 and the side walls and bottom of the wiring trench 12T.

In this structure shown in FIG. 1C, a Cu—Mn alloy layer 13CM is also formed on the barrier metal film 13BM so as to have the cross-sectional shape fitting the barrier metal film 13BM.

Furthermore, a Cu layer 13 is formed on the Cu—Mn alloy layer 13CM so as to fill the wiring trench 12T as shown in FIG. 1C.

Then, CMP is applied to shave the Cu layer 13, the Cu—Mn alloy layer 13CM and the barrier metal film 13BM existing therebeneath until the surface of the silicon dioxide film 12 is exposed. This step results in the structure shown in FIG. 1D, wherein the wiring trench 12T is filled with a Cu wiring pattern 13P.

Figure 1D:
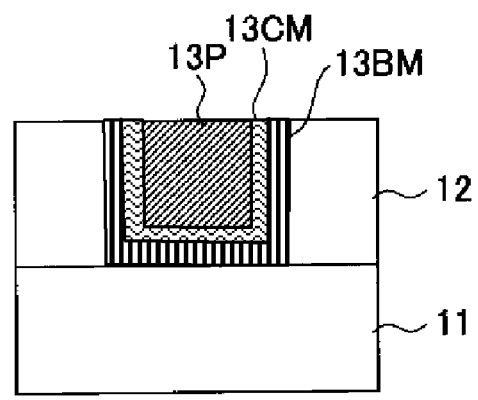
Figure 1E:
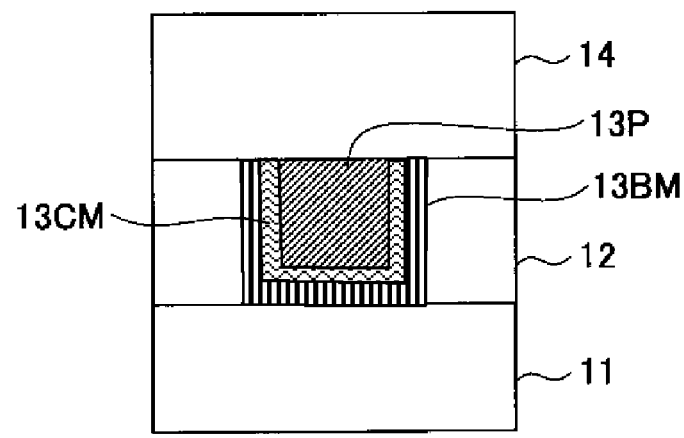
Figure 1F:
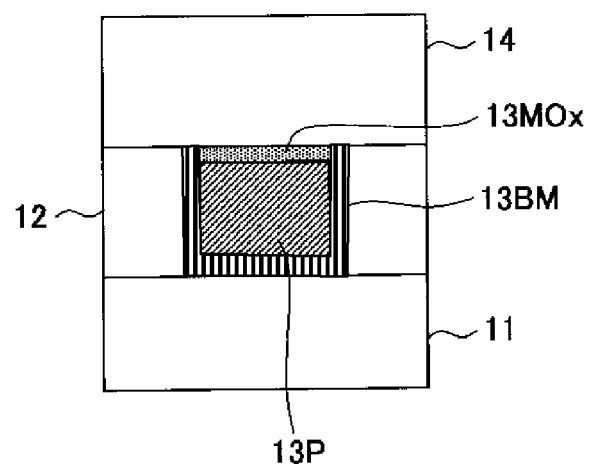

After that, as shown in FIG. 1E, another silicon dioxide film 14 consisting of an MSQ film is formed on the structure shown in FIG. 1D, and the structure shown in FIG. 1E is then heated at a given temperature, for example, 400° C. to provide the structure shown in FIG. 1F. As a result, Ms atoms contained in the Cu—Mn alloy layer 13CM are transported to the surface of the Cu wiring pattern 13P, and the transported Mn atoms react with oxygen and Si atoms existing in the silicon dioxide film 14, thereby forming a manganese oxide film 13MOx having a composition of $MnSi_xO_y$ on the surface of the Cu wiring pattern 13P.

This process may exclude the use of a SiN film or other kinds of etching stopper films with a high dielectric constant, which is placed between the insulating films 12 and 14 in a known method, and is expected to further reduce the parasitic capacitance of the Cu wiring pattern 13P.

It should be noted that the Cu—Mn alloy layer 13CM existing between the Cu wiring pattern 13P and the barrier metal film 13BM releases Mn atoms and this transportation of Mn atoms completely blurs the boundary between the Cu—Mn alloy layer 13CM and the Cu wiring pattern 13P.

Figure 2:
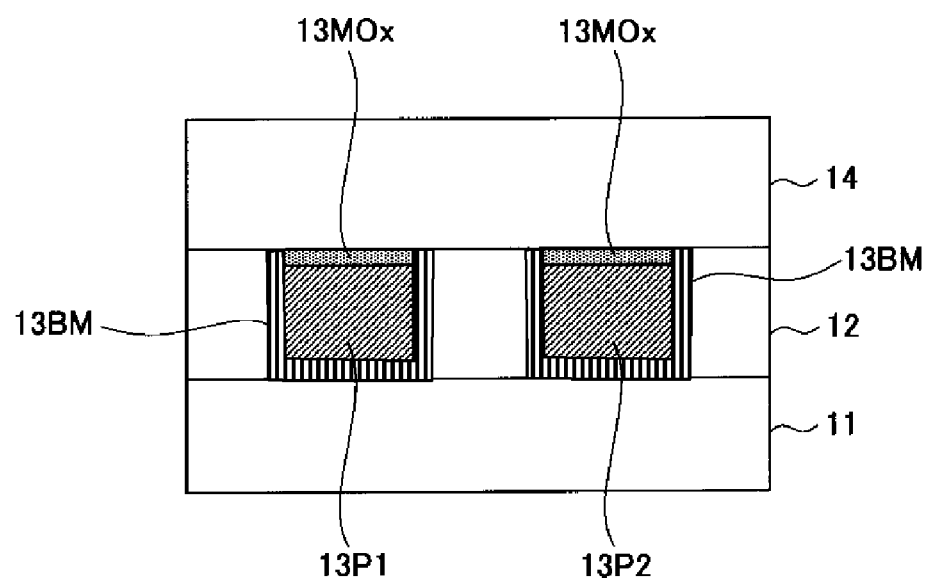
FIG. 2 is a diagram for explanation of a problem in the conventional art.

The wiring structure containing the Cu wiring pattern 13P shown in FIG. 1F may have an insufficient performance of the manganese oxide film 13MOx as a diffusion barrier. For example, Cu wiring patterns 13P formed side-by-side as shown in FIG. 2 could possibly generate a potential difference between themselves so that Cu ions released from one Cu wiring pattern 13P1 would diffuse into the other Cu wiring pattern 13P2, thereby leading to a short circuit.

However, surfaces of the Cu wiring patterns 13P1 and 13P2 other than the top surfaces are coated with a barrier metal film 13BM and thus diffusion of Cu atoms therefrom may be prevented.

In addition, These discusses a technique to make up for the insufficient performance of the above-mentioned manganese oxide film 13MOx as a diffusion barrier by covering the manganese oxide film 13MOx with a barrier film such as a SiCN film as shown in FIGS. 3A to 3D. It should be noted that the components in FIGS. 3A to 3D that have already been described above are numbered with the reference numerals used in the previous explanation to avoid repetition.

Figure 3A:
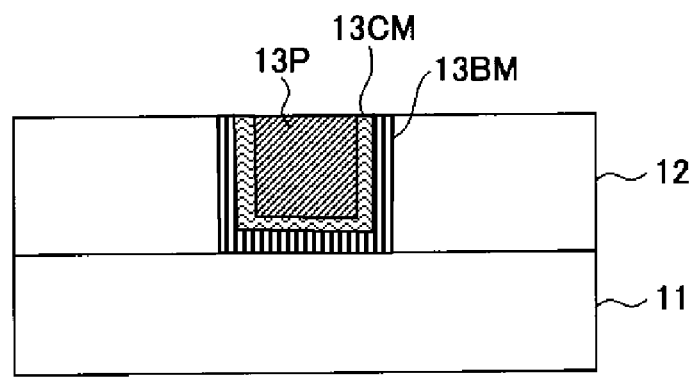
FIGS. 3A-3F are diagrams for explanation of another conventional art.
Figure 3B:
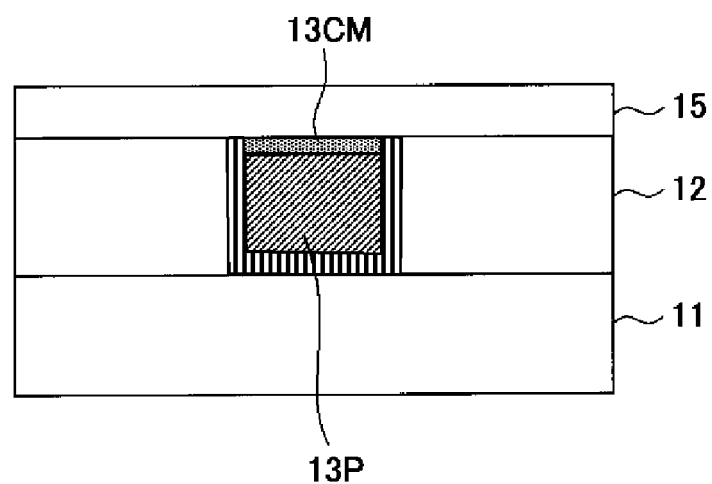

The structure illustrated in FIG. 3A is equivalent to that shown in FIG. 1D and thus formed through the steps described by FIGS. 1A to 1C. In FIG. 3B, a silicon dioxide film 15 having a composition identical or similar to that of the silicon dioxide film 12 described earlier is formed on the structure shown in FIG. 3A. Then, this structure is heated at a temperature of approximately 400° C. to form a manganese oxide film 13MOx covering the surface of the Cu wiring pattern 13P described earlier in the same manner as shown in FIG. 1F.

Figure 3C:
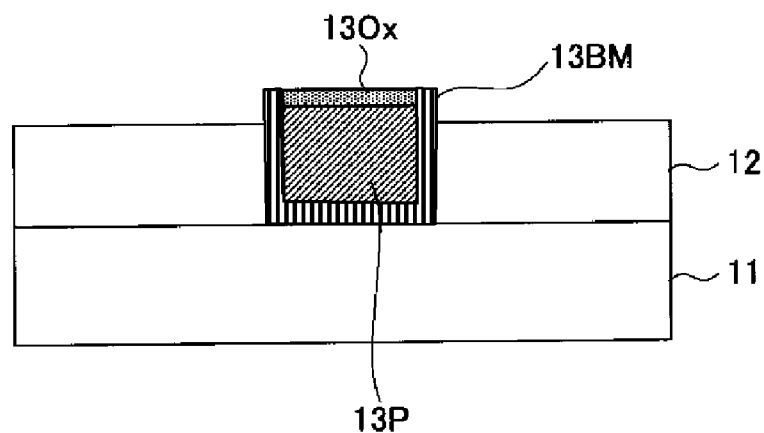

After that, as shown in FIG. 3C, the silicon dioxide film 15 and a portion of the silicon dioxide film 12 lying therebeneath are removed by wet etching or plasma etching until the manganese oxide film 13MOx is exposed.

In this step, it is difficult to stop the wet etching or plasma etching just at the time of the exposure of the manganese dioxide film 13MOx. Exposing the entire surface of the manganese oxide film 13MOx requires excessive etching. Therefore, in the structure shown in FIG. 3C, the upper part of the Cu wiring pattern 13P supporting the manganese oxide film 13MOx is also exposed so as to protrude from the insulating film 12.

Figure 3D:
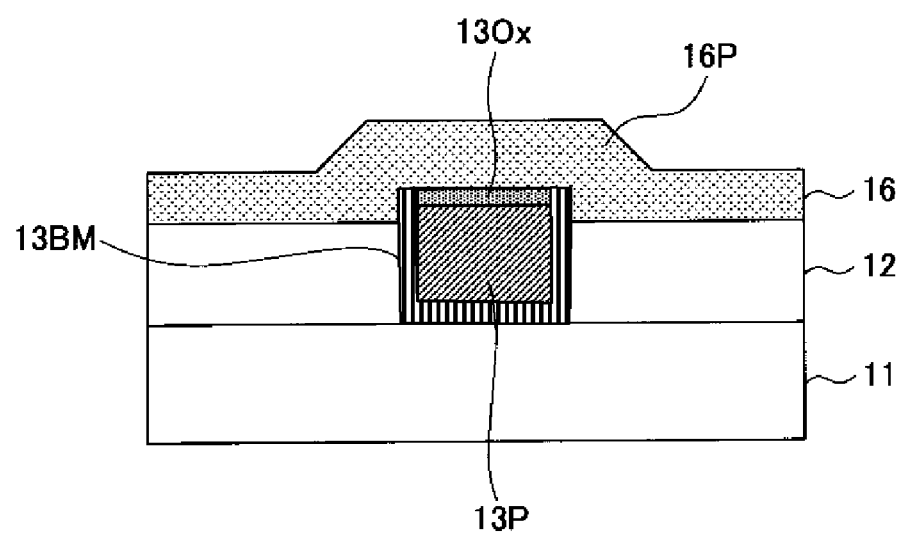
Figure 3E:
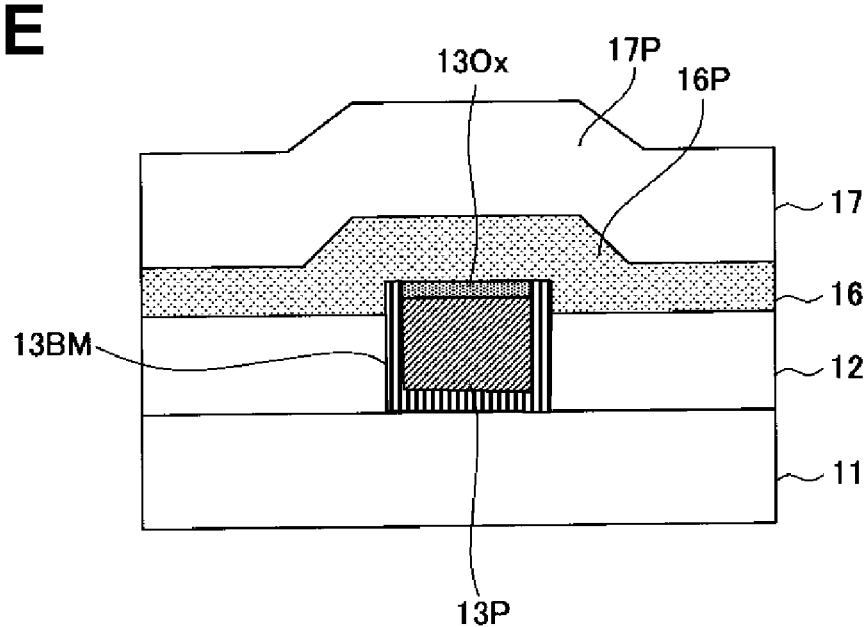

Then, as shown in FIG. 3D, a diffusion barrier film 16 consisting of a SiCN film is formed on the silicon dioxide film 12 so as to cover the protruding upper part of the Cu wiring pattern 13P in FIG. 3C. Thereafter, the next insulating film 17 is formed on this diffusion barrier film 16 as shown in FIG. 3E.

It should be noted that the upper part of the Cu wiring pattern 13P protrudes from the surface of the insulating film 12 as shown in FIG. 3D and accordingly the diffusion barrier film 16 has a protrusion 16P. This causes the insulating film 17 to have a protrusion 17P as shown in FIG. 3E.

Figure 3F:
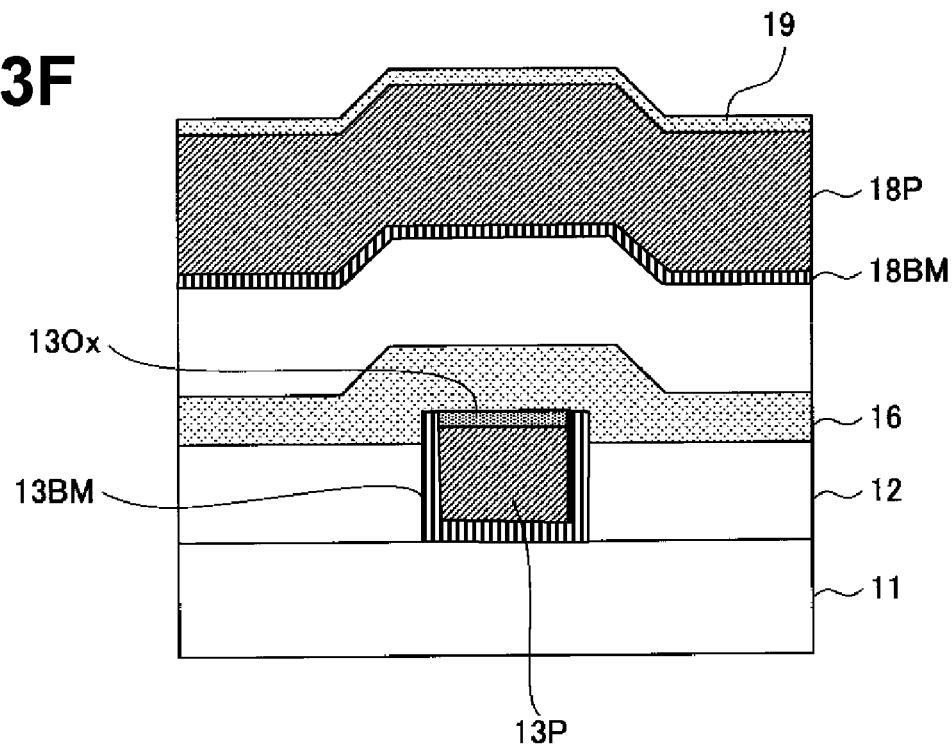

After that, the damascene process is applied to the inside of the insulating film 17 in the same manner as described earlier to form a Cu wiring pattern 18P that is supported by a barrier metal film 18BM and is coated with a manganese oxide film 19 as shown in FIG. 3F.

However, in such a structure, each upper Cu wiring pattern 18P extends so as to cross over the bumps made by the lower Cu wiring patterns 13P. This makes it likely that the upper Cu wiring patterns 18P and the lower Cu wiring patterns 13P become short-circuited.

Figure 4:
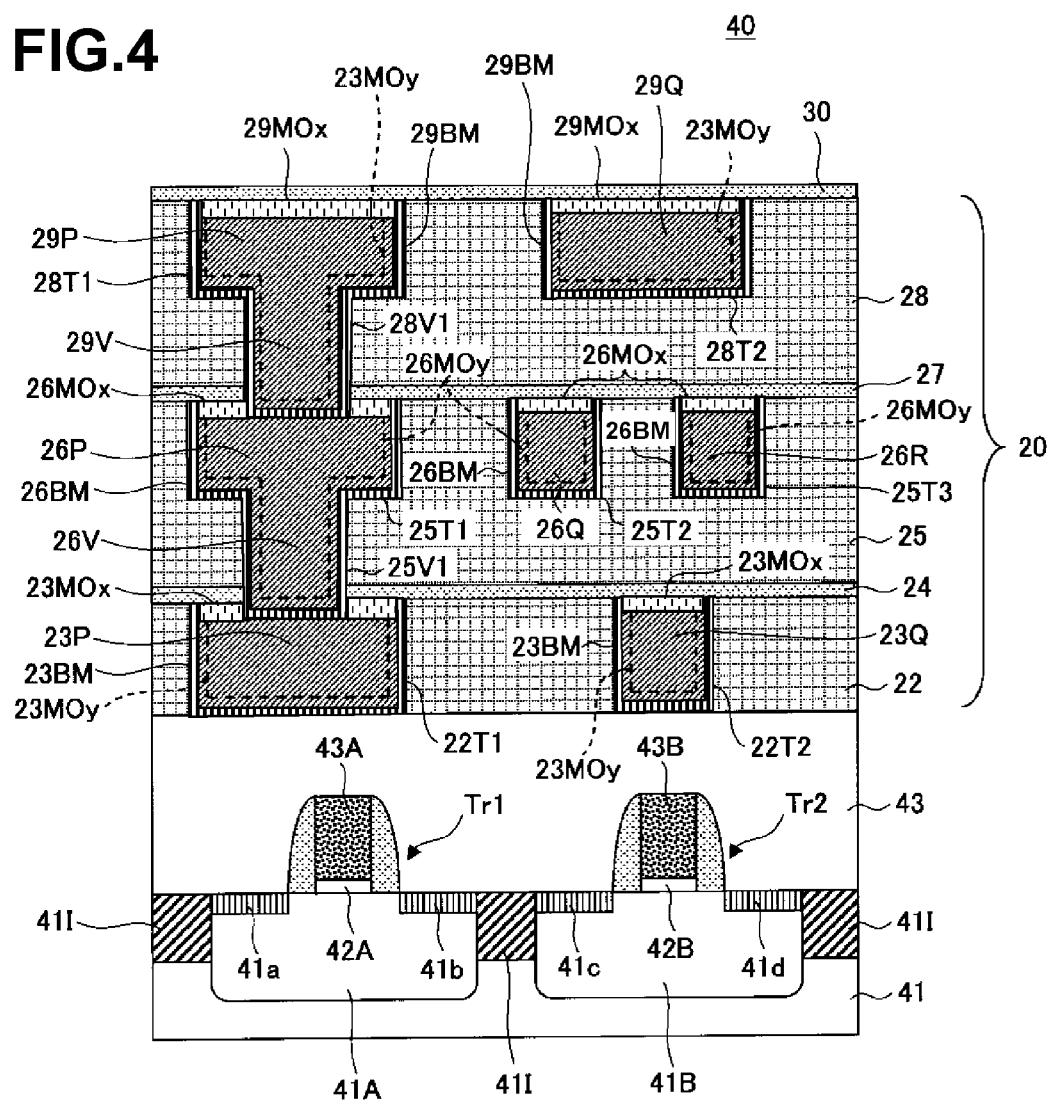
FIG. 4 is a diagram illustrating a configuration of a semiconductor device according to Embodiment 1.

FIG. 4 is a diagram illustrating a configuration of a semiconductor device according to Embodiment 1, and FIGS. 5A to 5M and FIG. 6 are diagrams illustrating a manufacturing process of the semiconductor device.

In FIG. 4, element regions 41A and 41B are defined on a silicon substrate 41 by element-isolating structures 41I. On the element region 41A, a gate insulating film 42A is positioned on the silicon substrate 41 and a gate electrode 43A made of polysilicon or the like is formed thereon, whereas on the element region 41B, a gate insulating film 42B is positioned on the silicon substrate 41 and a gate electrode 43B made of polysilicon or the like is formed thereon.

The gate electrode 43A has side walls coated with insulating films and, at both sides of this gate electrode 43A, diffusion regions 41a and 41b are formed by ion implantation in the element region 41A of the silicon substrate 41. Similarly, the gate electrode 43B also has side walls coated with insulating films and, at both sides of this gate electrode 43B, diffusion regions 41c and 41d are formed by ion implantation in the element region 41B of the silicon substrate 41. As a result, transistors Tr1 and Tr2 are formed in the element regions 41A and 41B, respectively.

The gate electrodes 43A and 43B are covered with an insulating film 43 formed on the silicon substrate 41, and a multilayer wiring structure 20 is formed on this insulating film 43. This multilayer wiring structure 20 will be detailed below.

As shown in FIG. 4, the multilayer wiring structure 20 has a so-called low-k interlayer insulating film 22 formed on the insulating film 43. Examples of this low-k interlayer insulating film 22 may include an MSQ film with a dielectric constant of 2.6, a hydrocarbon polymer film such as SiLK or Porous SiLK (registered trademarks of The Dow Chemical Company), and a SiOC film produced by plasma chemical vapor deposition (CVD).

The interlayer insulating film 22 is coated with a carbon-including insulating film 24 that contains carbon (C) and silicon (Si), has a thickness in the range of 15 nm to 30 nm, and preferably consisting of a SiC film or a SiCN film. As described later, this carbon-including insulating film 24 further includes oxygen (O).

On the carbon-including insulating film 24, a low-k interlayer insulating film equivalent to the above-mentioned low-k interlayer insulating film 22 is formed so as to have a thickness, for example, in the range of 250 nm to 300 nm. This low-k interlayer insulating film 25 is coated with a carbon (as well as silicon and oxygen)—including insulating film 27 that is equivalent to the above-mentioned carbon-including insulating film 24 and has a thickness in the range of 15 nm to nm.

Furthermore, on the carbon-including insulating film 27, a low-k interlayer insulating film 28 equivalent to the above-mentioned low-k interlayer insulating films 22 and 25 is formed so as to have a thickness, for example, in the range of 250 nm to 300 nm. This low-k interlayer insulating film 28 is also coated with a carbon (as well as silicon and oxygen)—including insulating film 30 that is equivalent to the above-mentioned carbon-including insulating films 24 and 27 and has a thickness in the range of 15 nm to 30 nm.

Through the interlayer insulating film 22, wiring trenches 22T1 and 22T2 are carved, which are filled with Cu wiring patterns 23P and 23Q, respectively. Side walls of these wiring trenches 22T1 and 22T2 are each coated with a barrier metal film 23BM consisting of a high-melting-point metal such as Ta, Ti, or W, or a conductive nitride thereof such as TaN, TiN, or WN. Strictly speaking, the adjective "metal" may not be used to describe a barrier metal film 23BM consisting of a conductive nitride. However, in the present embodiment, such a barrier film is also referred to as "a barrier metal film" in accordance with established practice. Meanwhile, the top of the Cu wiring pattern 23P is covered with a manganese oxide film 23MOx that includes carbon, has a composition of $MnSi_xO_yC_z$ (x=0.3 to 1.0; y=0.75 to 3.0; z=0.2 to 0.7), and formed along the carbon-including insulating film 24 so as to have a thickness approximately in the range of 1 nm to 5 nm. Such a manganese oxide film 23MOx is also formed on the top of the Cu wiring pattern 23Q. A more detailed description of this manganese oxide film 23MOx will be provided later.

As described later, the boundary between the Cu wiring pattern 23P and the barrier metal film 23BM consists of a manganese oxide film 23MOy formed so as to have a thickness in the range of 1 nm to 5-nm and a composition different from that of the manganese oxide film 23MOx. This manganese oxide film 23MOy includes no or little carbon and Si, and the concentrations of these elements included therein are substantially lower than those in the manganese oxide film 23MOx, if any. For example, the manganese oxide film 23MOy has a composition of $MnO_pC_q$ (p=0.5 to 1.5; q=0.01 to 0.05; q<z).

Through the interlayer insulating film 25, wiring trenches 25T1, 25T2, and 25T3 are carved, and these wiring trenches 25T1, 2ST2, and 2ST3 are filled with Cu wiring patterns 26P, 26Q, and 26R, respectively. The lower part of the Cu wiring pattern 26P forms a Cu via plug 26V, which extends through the manganese oxide film 23MOx to make an electrical contact with the Cu wiring pattern 23P.

The side walls of the wiring trenches 25T1, 25T2, and 2ST3 are each coated with a barrier metal film 26BM equivalent to the barrier metal film 23BM. On the top of the Cu wiring pattern 26P, a manganese oxide film 26MOx equivalent to the manganese oxide film 23MOx is formed along the carbon-including insulating film 27 so as to have a thickness approximately in the range of 1 nm to 5 nm. Such a manganese oxide film 26MOx is also formed on the top of the Cu wiring patterns 26Q and 26R.

The boundary between the Cu wiring pattern 26P and the barrier metal film 26BM consists of a manganese oxide film 26MOy that is equivalent to the manganese oxide film 23MOy and formed so as to have a thickness in the range of 1 nm to 5 nm.

Through the interlayer insulating film 28, wiring trenches 28T1 and 28T2 are carved, and these wiring trenches 28T1 and 28T2 are filled with Cu wiring patterns 29P and 29Q, respectively. The lower part of the Cu wiring pattern 29P forms a Cu via plug 29V, which extends through the manganese oxide film 26MOx to make an electrical contact with the Cu wiring pattern 26P.

The side walls of the wiring trenches 28T1 and 28T2 are each coated with a barrier metal film 29BM equivalent to the barrier metal films 23BM and 26BM. On the top of the CU wiring pattern 29P, a manganese oxide film 29MOx equivalent to the manganese oxide films 23MOx and 26MOx is formed along the carbon-including insulating film 30 so as to have a thickness approximately in the range of 1 nm to 5 nm.

Such a manganese oxide film 29MOx is also formed on the top of the Cu wiring pattern 29Q.

The boundary between the Cu wiring pattern 29P and the barrier metal film 29BM consists of a manganese oxide film 29MOy that is equivalent to the manganese oxide films 23MOy and 26MOy and formed so as to have a thickness in the range of 1 nm to 5 nm.

In a semiconductor device 40 having the multilayer wiring structure 20 configured as above, each of the insulating films 23MOx, 26MOx, and 29MOx formed on the Cu wiring patterns 23P and 23Q, 26P to 26R, and 29P and 29Q, respectively, includes a substantial amount of carbon as described above, and this reduces interatomic distances inside the films, thereby providing stronger chemical bonds. As a result, these insulating films act as excellent diffusion barriers and effectively prevent diffusion of Cu atoms constituting wiring patterns into low-dielectric-constant interlayer insulating films, thereby avoiding short circuits and other defects.

Next, a manufacturing process of the semiconductor device 40, in particular, a process of forming the multilayer wiring structure, is described with reference to FIGS. 5A to 5L and FIG. 6.

Figure 5A:
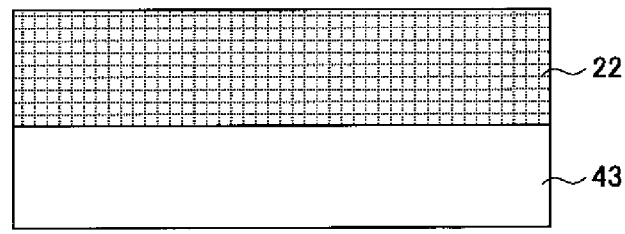
FIGS. 5A-5L are diagrams illustrating a manufacturing process of the semiconductor device according to Embodiment 1.

In FIG. 5A, the insulating film 43 is formed on the silicon substrate 41 so as to cover the transistors Tr1 and Tr2, and then the interlayer insulating film 22 is formed on the insulating film 43. Examples of this interlayer insulating film 22 may include an MSQ film or other $SiO_2$-based low-dielectric-constant films formed by a coating method, a hydrocarbon polymer film such as SiLK or Porous SiLK (registered trademarks of The Dow Chemical Company), and a SiOC film produced by plasma CVD.

Figure 5B:
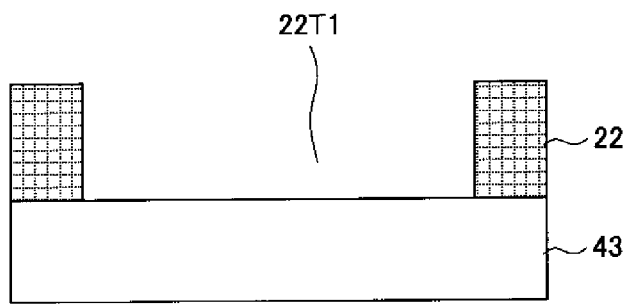

In the next step, the wiring trench 22T1 is carved through the interlayer insulating film 22 as shown in FIG. 5B. Although not shown in the drawing, the wiring trench 22T2 is also carved through the interlayer insulating film 22.

Figure 5C:
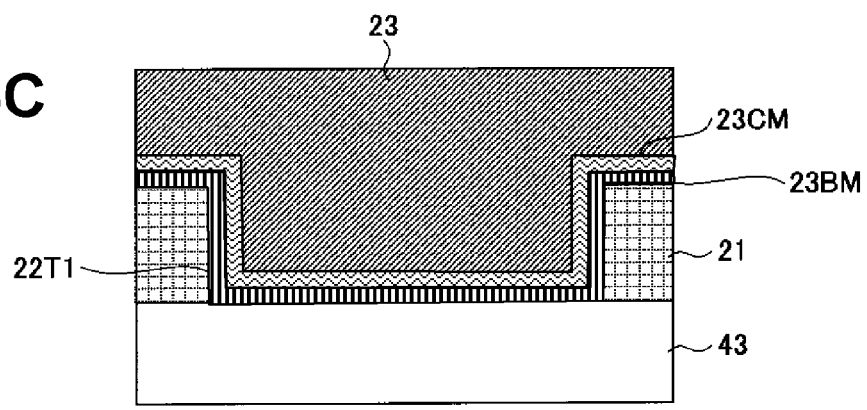

Then, as shown in FIG. 5C, the barrier metal film 23BM is formed on the interlayer insulating film 22 by sputtering of a Ta film, Ti film, or W film at room temperature so as to have the cross-sectional shape fitting the wiring trench 22T1 and have a thickness in the range of 2 nm to 5 nm. To form this barrier metal film 23BM, reactive sputtering of a conductive nitride film such as a TaN film, TiN film, or WN film under nitrogen atmosphere may be used. The temperature of the substrate required for sputtering is approximately 400° C. Although not shown in the drawing, such a barrier metal film 23BM is also formed on the wiring trench 22T2.

In the step shown in FIG. 5C, a Cu—Mn alloy layer 23CM is also formed on the barrier metal film 23BM by sputtering of Cu—Mn alloy at room temperature. This Cu—Mn alloy layer 23CM includes Mn atoms at a concentration in the range of 0.2 to 1.0 atomic percent or preferably at a concentration equal to or less than 0.5 atomic percent, has the cross-sectional shape fitting the wiring trench 22T1, and has a thickness in the range of 5 nm to 30 nm. Although not shown in the drawing, such a Cu—Mn alloy layer 23CM is also formed on the wiring trench 22T2.

FIG. 5C also includes a Cu layer 23, which is formed on the Cu—Mn alloy layer 23CM by seed layer formation and electrolytic plating so as to fill the wiring trench 22T1 and, although not shown in the drawing, the wiring trench 22T2 as well.

Figure 5D:
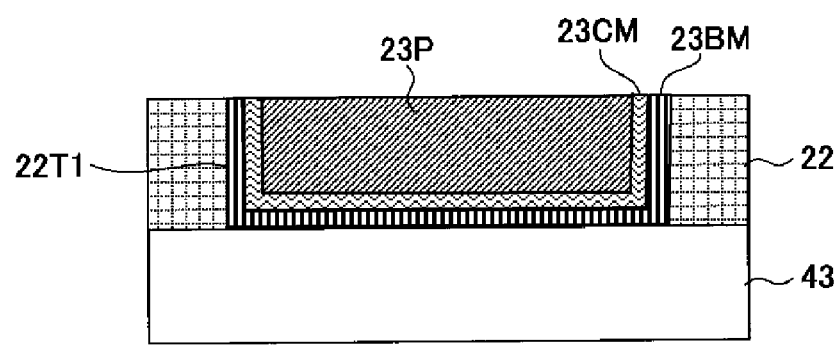

Thereafter, as shown in FIG. 5D, the Cu layer 23, and the Cu—Mn alloy layer 23CM and the barrier metal films 23BM formed therebeneath are shaved by CMP until the surface of the interlayer insulating film 22 is exposed. This results in the formation of the Cu wiring pattern 23P in the wiring trench 22T1 and, although not shown in the drawing, the Cu wiring pattern 23Q in the wiring trench 22T2.

Figure 5E:
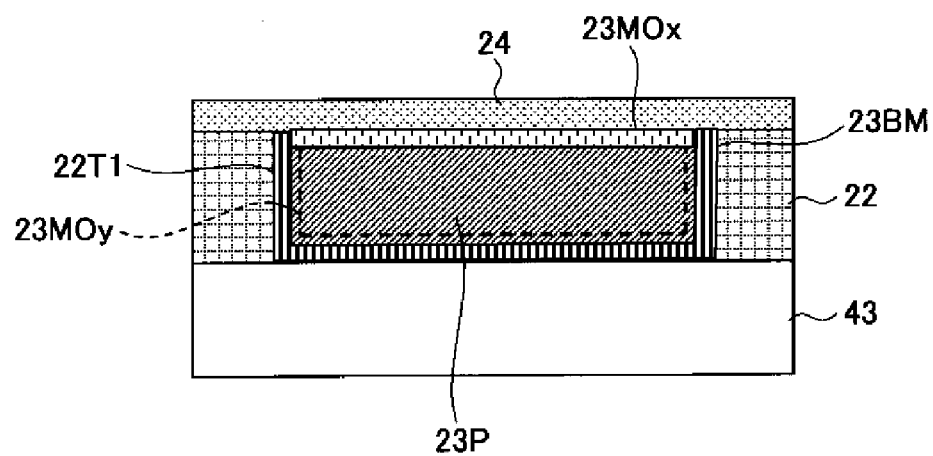

In this embodiment, the structure obtained in FIG. 5D is then coated with the carbon-including insulating film 24 having a thickness in the range of 15 nm to 30 nm as shown in FIG. 5E. The carbon-including insulating film 24 used in this embodiment is a SiCN film, which is formed by plasma CVD of a material including Si and C such as trimethylsilane (SiH(CH$_3$)$_3$) and a different material including nitrogen such as NH$_3$ with the substrate temperature being, for example, in the range of 350 to 400° C. Oxygen is added in the course of forming the carbon-including insulating film 24 so that the entire film includes oxygen at a concentration in the range of 3 to 18 atomic percent.

Figure 6:
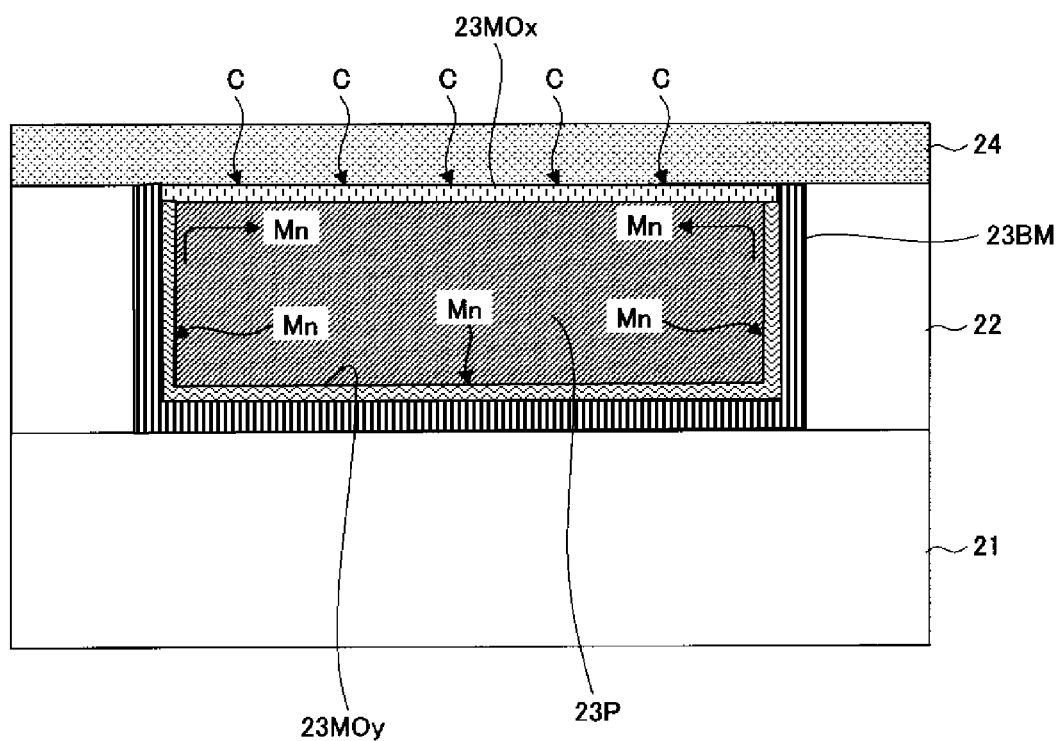
FIG. 6 is a diagram for explanation of reaction that occurs in a process according to Embodiment 1.

During this step shown in FIG. 5E, heat generated by the formation of the carbon-including insulating film 24 transports Mn atoms existing in the Cu—Mn alloy layer 23CM to the surface of the Cu wiring pattern 23P as shown in FIG. 6. The transported Mn atoms react with Si, carbon, and oxygen atoms supplied by the carbon-including insulating film 24. As a result, a manganese oxide film 23MOx is formed on the surface of the Cu wiring pattern 23P while spreading along the carbon-including insulating film 24. The manganese oxide film 23MOx formed in this way has a composition of $MnSi_xO_yC_z$ including composition parameters x, y, and z.

A manganese oxide film 23MOx was actually prepared in the same way and analyzed by energy dispersive X-ray spectroscopy (EDX). This analysis found that the composition parameter x was in the range of 0.3 to 1.0, y was in the range of 0.75 to 3.0, and z was in the range of 0.2 to 0.7. Furthermore, secondary ion mass spectroscopy (SIMS) of a sample structure wherein a flat Cu—Mn film was coated with a Cu film and the Cu film was then coated with a SiCN film and the entire structure was heated at a temperature of 400° C. also demonstrated that this method, wherein a SiCN film is formed in contact with a Cu—Mn film, may be used to provide a manganese oxide film that has a composition of $MnSi_xO_yC_z$ and spreads between the SiCN and Cu—Mn films.

The step represented by FIG. 5E also involves transportation of a small number of oxygen atoms from the interlayer insulating film 22 through the barrier metal film 23BM to the Cu wiring pattern 23P during heat treatment associated with the formation of the carbon-including insulating film 24. As shown in FIG. 6, such oxygen atoms react with some of Mn atoms initially included in the Cu—Mn alloy layer 23CM, thereby producing another manganese oxide film 23MOy between the barrier metal film 23BM and the Cu wiring pattern 23P. This manganese oxide film 23MOy includes no or little carbon and Si, and the concentrations of these elements included therein are lower than those in the manganese oxide film 23MOx, if any. Therefore, the manganese oxide film 23MOy produced in this way has a composition of $MnO_pC_q$ wherein the composition parameter p is in the range of 0.5 to 1.5 and q is in the range of 0.01 to 0.05, as described earlier. It should be noted that q is smaller than z.

The original Cu—Mn alloy layer 23CM is reduced as such manganese oxide films 23MOx and 23MOy are formed and finally disappears at the end of the step represented by FIG. 5E due to replacement with a Cu layer serving as a part of the Cu wiring pattern 23P.

Figure 5F:
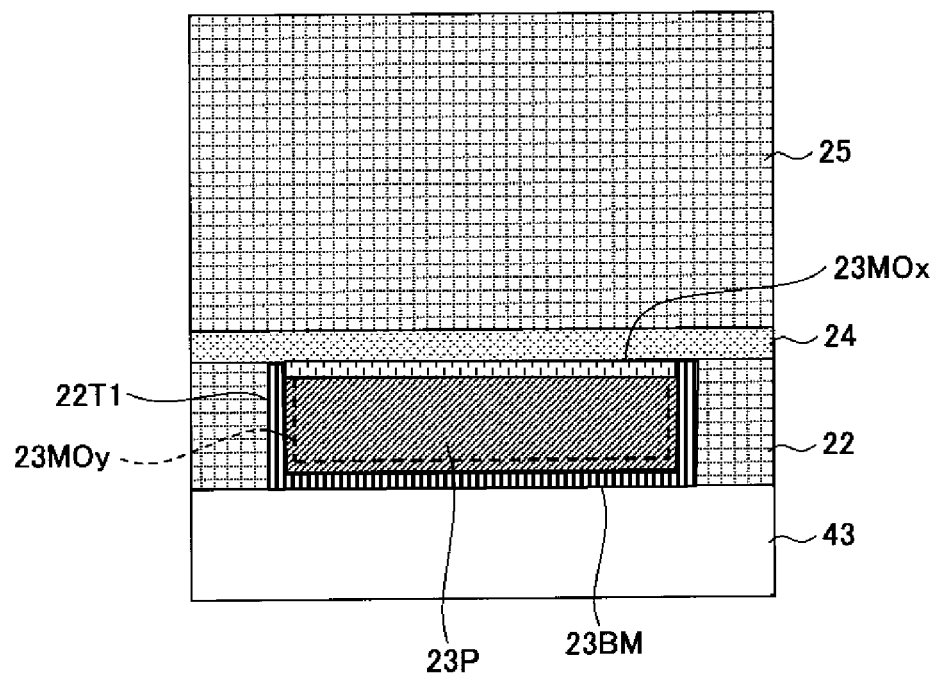
Figure 5G:
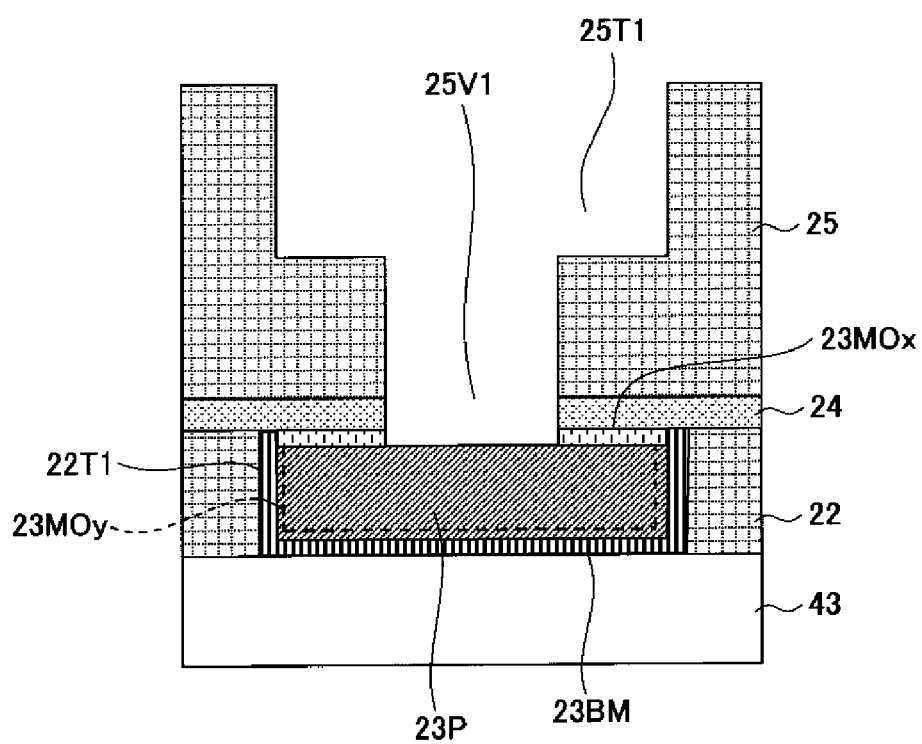

In the next step shown in FIG. 5F, the structure illustrated by FIG. 5E is covered with the interlayer insulating film 25 formed in the same manner as the interlayer insulating film 22. After that, as shown in FIG. 5G, a wiring trench 2ST1 and a via hole 25V1 are carved in preparation for the formation of the Cu wiring pattern 26P, and this exposes the Cu wiring pattern 23P under the wiring trench 25T1 and the via hole 25V1. At the same time, the wiring trenches 25T2 and 25T3 are carved through the interlayer insulating film 25 in preparation for the formation of the Cu wiring patterns 26Q and 26R, respectively.

Figure 5H:
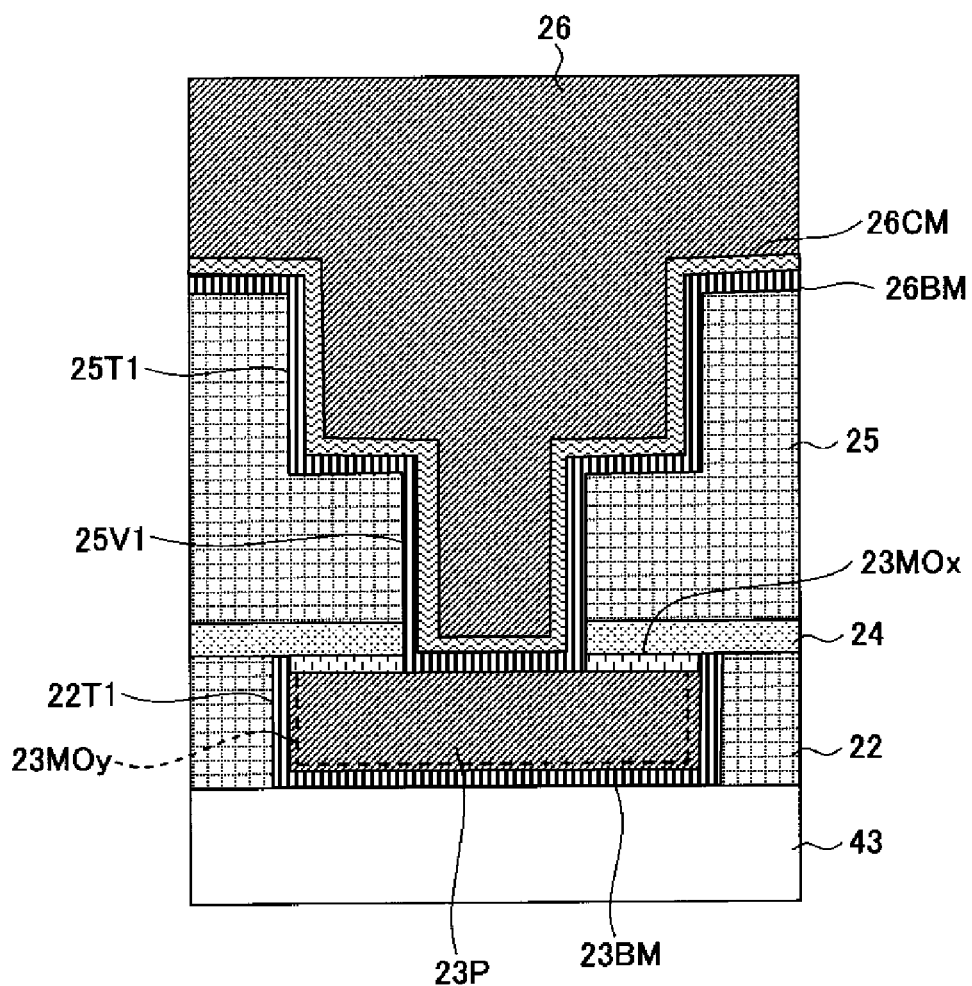

Then, as shown in FIG. 5H, the barrier metal film 26BM is formed on the interlayer insulating film 25, which is illustrated in FIG. 5G, by sputtering of a Ta film, Ti film, or W film at room temperature so as to have the cross-sectional shape fitting the wiring trench 25T1 and has a thickness in the range of 2 nm to 5 nm. To form this barrier metal film 26BM, reactive sputtering of a conductive nitride film such as a TaN film, TiN film, or WN film under nitrogen atmosphere may be used. The temperature of the substrate required for sputtering is approximately 400° C. Although not shown in the drawing, such a barrier metal film 26BM is also formed on the wiring trenches 25T2 and 25T3.

In the step shown in FIG. 5H, a Cu—Mn alloy layer 26CM is also formed on the barrier metal film 26BM by sputtering of Cu—Mn alloy at room temperature. This Cu—Mn alloy layer 26CM includes Mn atoms at a concentration in the range of 0.2 to 1.0 atomic percent, has the cross-sectional shape fitting the wiring trench 25T1, and has a thickness in the range of 5 nm to 30 nm. Although not shown in the drawing, such a Cu—Mn alloy layer 26CM is also formed on the wiring trenches 25T2 and 25T3.

FIG. 5H also includes a Cu layer 26, which is formed on the Cu—Mn alloy layer 26CM by seed layer formation and electrolytic plating so as to fill the wiring trench 25T1 and, although not shown in the drawing, the wiring trenches 25T2 and 25T3 as well.

Figure 5I:
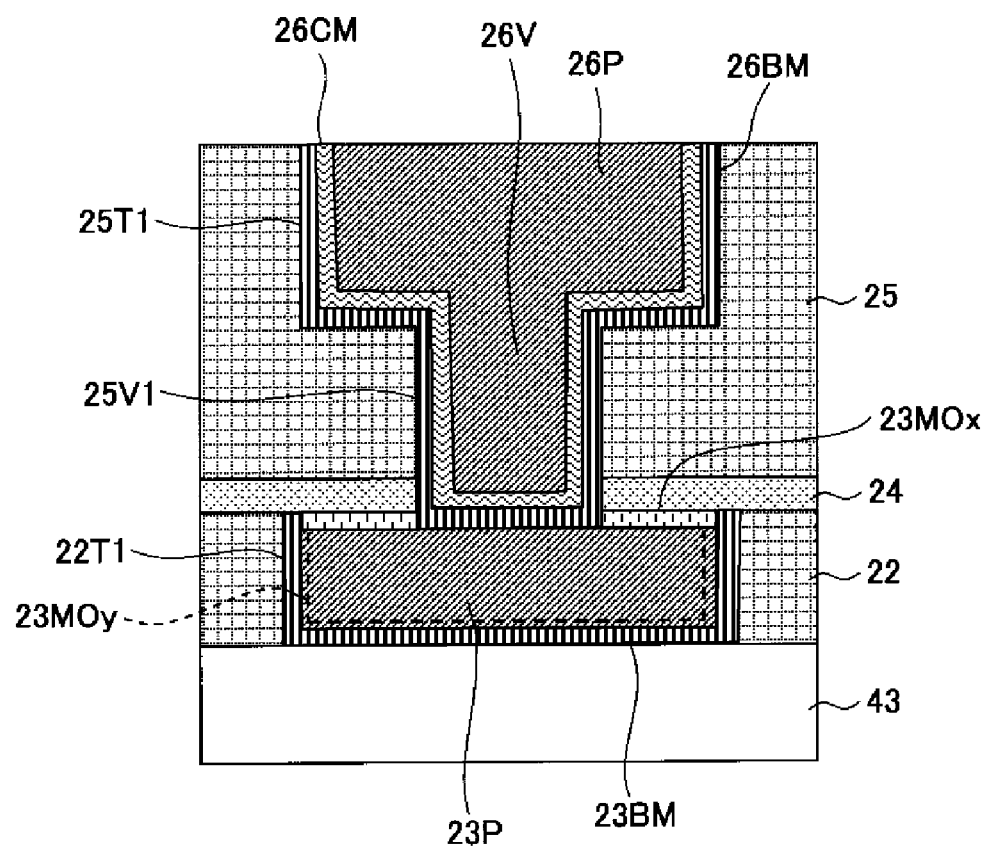

Thereafter, as shown in FIG. 5I, the Cu layer 26, and the Cu—Mn alloy layer 26CM and the barrier metal film 26BM formed therebeneath are shaved by CMP until the surface of the interlayer insulating film 25 is exposed. This results in the formation of the Cu wiring pattern 26P in the wiring trench 25T1 and, although not shown in the drawing, the Cu wiring patterns 26Q and 26R in the wiring trenches 25T2 and 25T3, respectively.

Figure 5J:
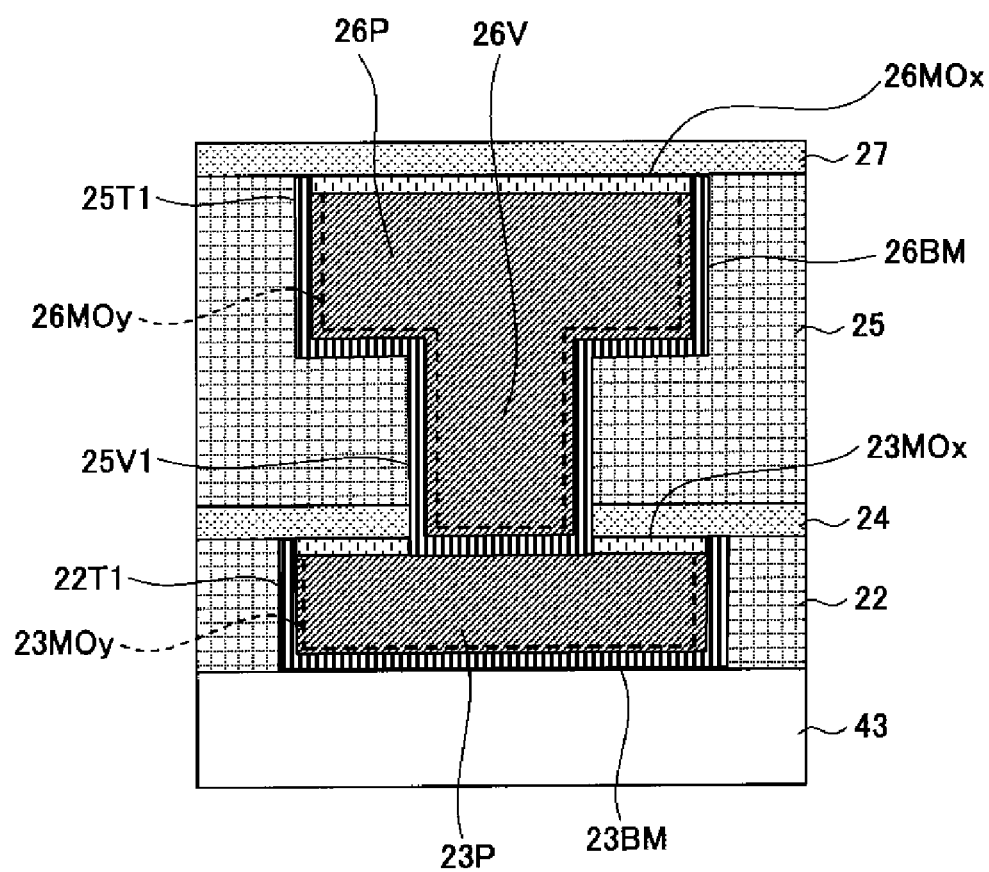

In this embodiment, the structure obtained in FIG. 5I is then coated with the carbon-including insulating film 27 having a thickness in the range of 15 nm to 30 nm as shown in FIG. 5J. The carbon-including insulating film 27 used in this embodiment is a SiCN film, which is formed by plasma CVD of a material including Si and C such as trimethylsilane (SiH(CH$_3$)$_3$) and a different material including nitrogen such as NH$_3$ with the substrate temperature being, for example, in the range of 350 to 400° C. Oxygen is added in the course of forming the carbon-including insulating film 27 so that the entire film includes oxygen at a concentration in the range of 3 to 18 atomic percent.

During this step shown in FIG. 5J, heat generated by the formation of the carbon-including insulating film 27 transports Mn atoms existing in the Cu—Mn alloy layer 26CM to the surface of the Cu wiring pattern 26P as described earlier using FIG. 6. The transported Mn atoms react with Si, carbon, and oxygen atoms supplied by the carbon-including insulating film 27. As a result, a manganese oxide film 26MOx having a composition of MnSi$_x$O$_y$C$_z$ is formed on the surface of the Cu wiring pattern 26P while spreading along the carbon-including insulating film 27, in the same manner as the manganese oxide film 23MOx.

The step represented by FIG. 5J also involves transportation of a small number of oxygen atoms from the interlayer insulating film 25 through the barrier metal film 26BM to the Cu wiring pattern 26P during heat treatment associated with the formation of the carbon-including insulating film 27. As described earlier using FIG. 6, such oxygen atoms react with some of Mn atoms initially included in the Cu—Mn alloy layer 26CM, thereby producing another manganese oxide film 26MOy between the barrier metal film 26BM and the Cu wiring pattern 26P (via plug 26V) in the same manner as the manganese oxide film 23MOy. This manganese oxide film 26MOy includes no or little carbon and Si, and the concentrations of these elements included therein are lower than those in the manganese oxide film 26MOx, if any.

Also in this case, the original Cu—Mn alloy layer 26CM is reduced as such manganese oxide films 26MOx and 26MOy are formed and finally disappears at the end of the step represented by FIG. 5J.

Figure 5K:
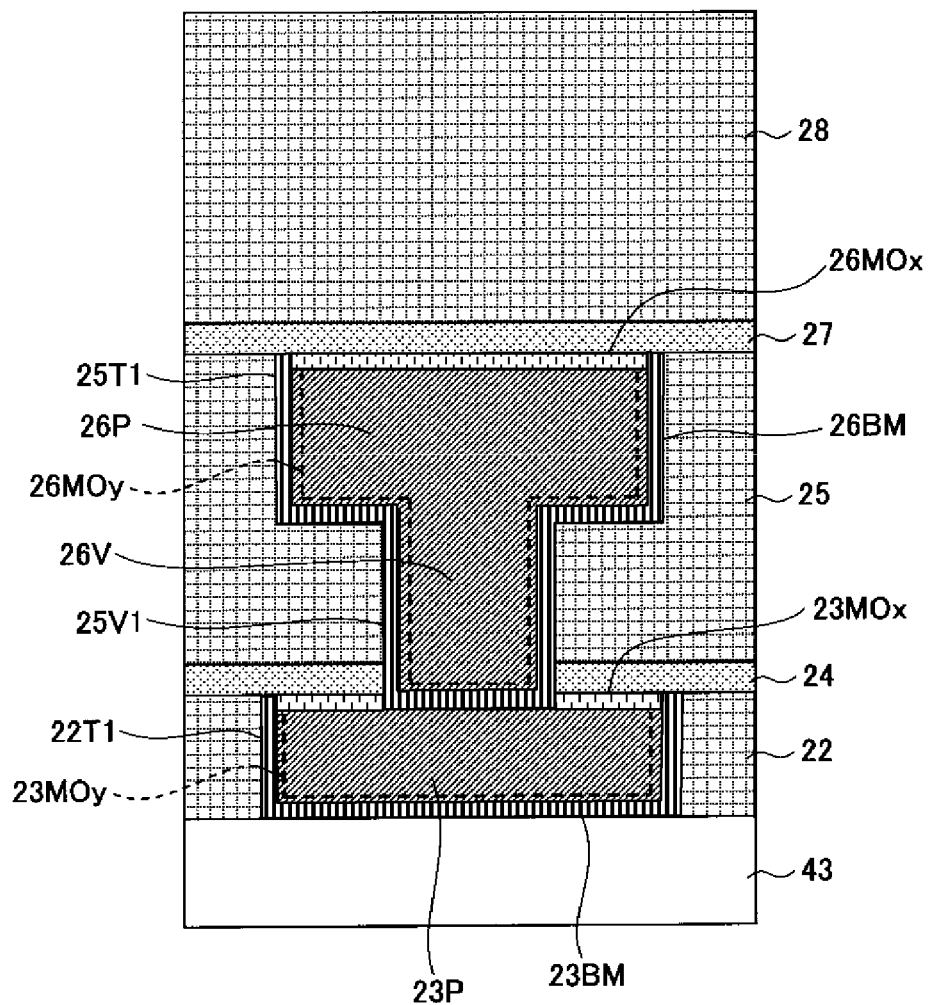
Figure 5L:
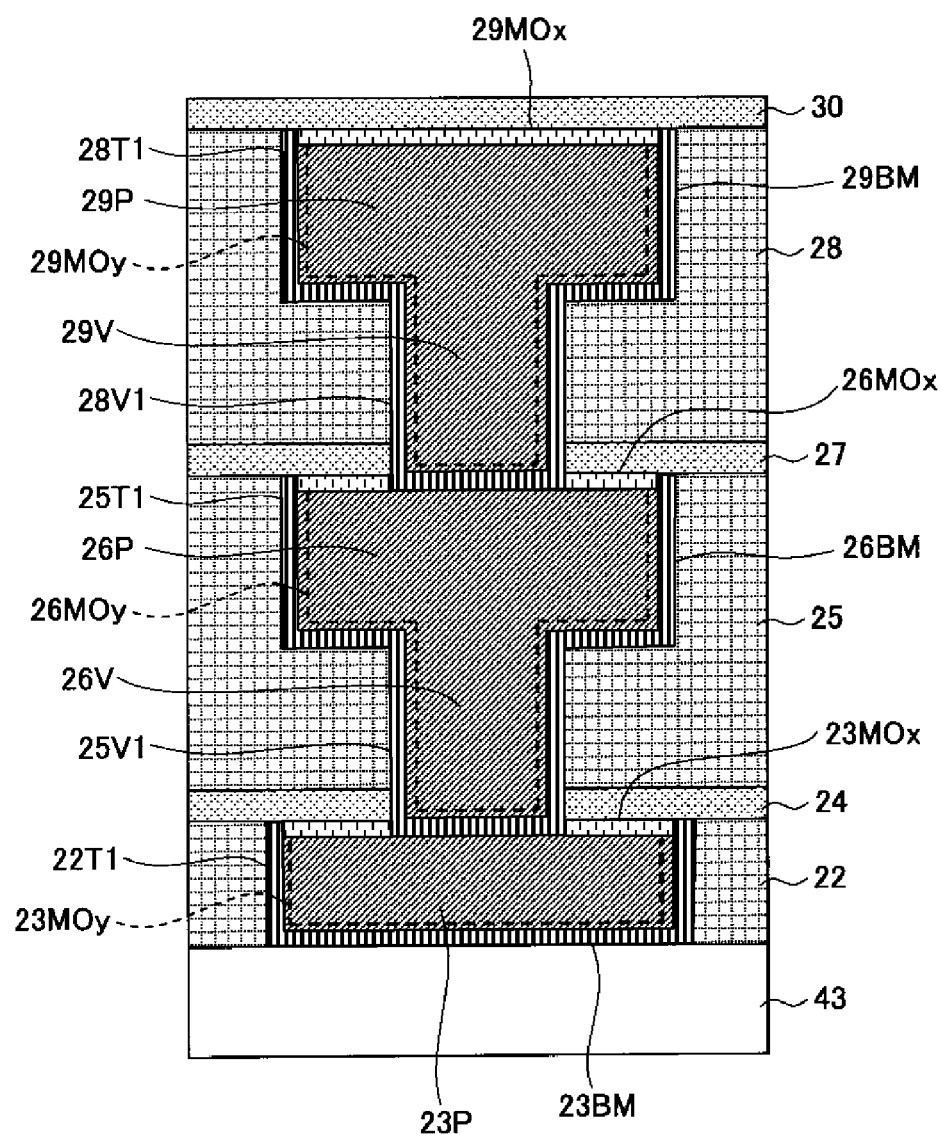

In the next step shown in FIG. 5K, the structure illustrated by FIG. 5J is covered with the interlayer insulating film 28 formed in the same manner as the interlayer insulating films 22 and 25. Then, the steps shown in FIGS. 5G to 5I are repeated to carve the wiring trench 28T1 through the interlayer insulating film 28, to cover the wiring trench 28T1 with the barrier metal film 29BM, and then to fill the wiring trench 28T1 with the Cu wiring pattern 29P. After that, in the upper part of the Cu wiring pattern 29P, the manganese oxide film 29MOx is formed in the same manner as the manganese oxide films 23MOx and 26MOx along a carbon-including insulating film 30 formed as with the carbon-including insulating film 27. In the boundary between the Cu wiring pattern 29P and the barrier metal film 29BM, the manganese oxide film 29MOy is formed in the same manner as the manganese oxide films 23MOy and 26MOy.

Figure 7:
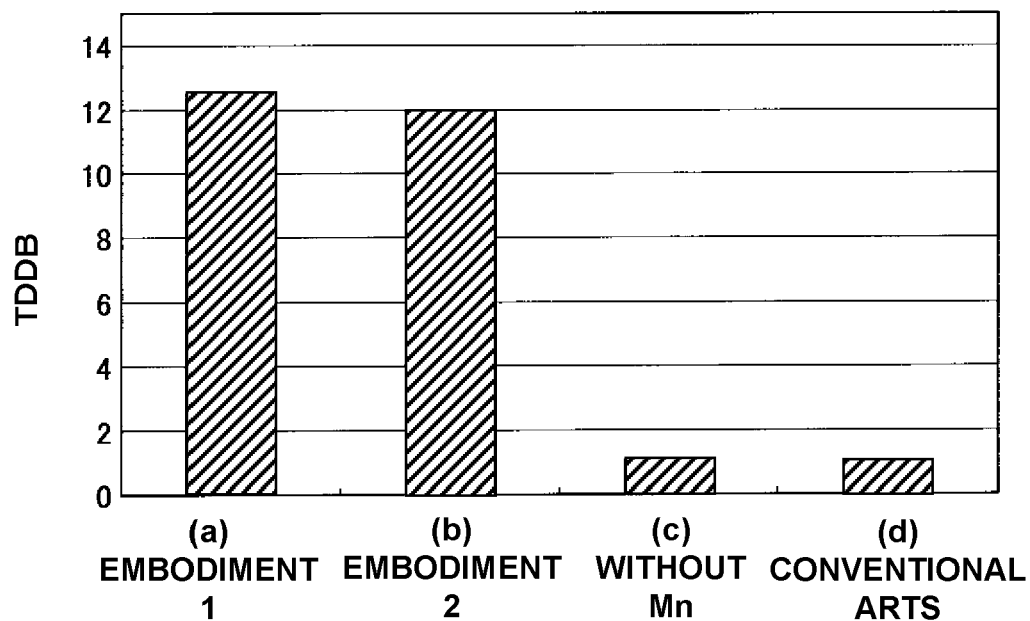
FIG. 7 is a diagram for explanation of the advantageous effect of Embodiments 1 and 2.

FIG. 7 shows the result of a time-dependent dielectric breakdown test (TDDB test) conducted using a semiconductor device 40 having the multilayer wiring structure 20 configured as above.

In FIG. 7, "(d) CONVENTIONAL ART" indicates the result obtained using a standard device that was tested as a control of the present embodiment and corresponds to the structure described earlier using FIG. 2. This standard device was configured as follows: the Cu wiring patterns 13P each having a width of 70 nm were arranged at intervals of 70 nm; the barrier metal film 13BM had a thickness of 2 nm; and the manganese oxide film 13MOx had a thickness of 20 nm and a composition of MnSi$_x$O$_y$ wherein the composition parameter x is 0.3 and y is 0.5.

Figure 8A:
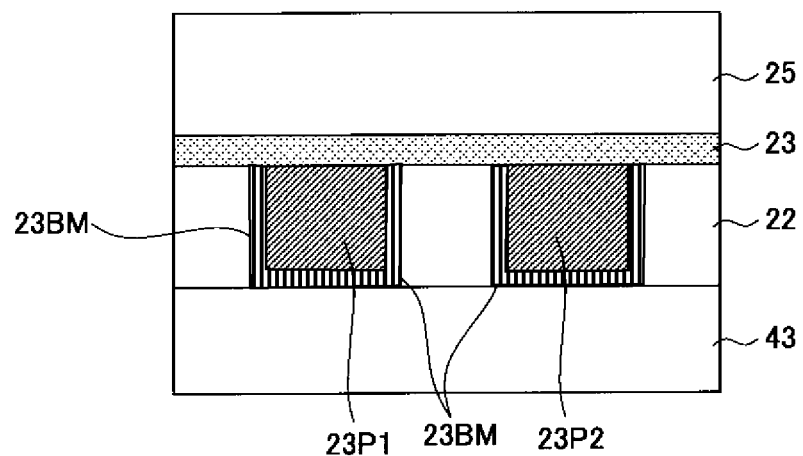
FIG. 8A is a diagram illustrating a configuration of a standard device tested as a control to demonstrate the advantageous effect of Embodiment 1.

"(c) WITHOUT Mn" in FIG. 7 indicates the result obtained using another standard device tested as a control, which was prepared excluding the formation of the Cu—Mn alloy layer 23CM in the steps shown in FIGS. 5A to 5E and thus had no manganese oxide film 23MOx on the top of Cu wiring patterns 23P1 and 23P2 as shown in FIG. 8A. In this standard device, the formation of the manganese oxide films 23MOy, which would have been formed on the side walls and the bottom of the Cu patterns, was accordingly omitted. It should be noted that the components in FIG. 8A that have already been described above are numbered with the reference numerals used in the previous explanation to avoid repetition. For comparison, this standard device included the interlayer insulating films 22 and 25 having the same composition and the same thickness as those of the interlayer insulating films 12 and 14 shown in FIG. 2 as well as a barrier metal film 23BM having the same composition and the same thickness as the barrier metal film 13BM shown in FIG. 2. The width and intervals of the Cu wiring patterns 23P1 and 23P2 were the same as those used in the standard device illustrated in FIG. 2.

Figure 8B:
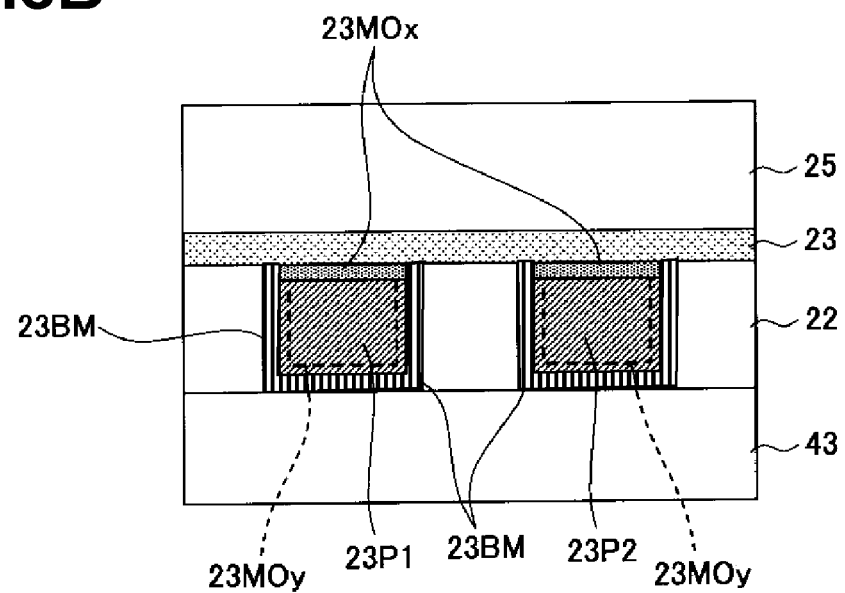
FIG. 8B is a diagram illustrating a configuration of a device used to demonstrate the advantageous effect of Embodiment 1.

"(a) EMBODIMENT 1" in FIG. 7 indicates the result obtained using the device that corresponds to Embodiment 1 described earlier and thus Cu wiring patterns 23P1 and 23P2 thereof were formed in the steps described using FIGS. 5A to 5F, as illustrated in FIG. 8B. It should be noted that the components in FIG. 8B that have already been described above are numbered with the reference numerals used in the previous explanation to avoid repetition. For comparison, this device included the interlayer insulating films 22 and 25 having the same composition and the same thickness as those of the interlayer insulating films 12 and 14 shown in FIG. 2 as well as a barrier metal film 23BM having the same composition and the same thickness as the barrier metal film 13BM shown in FIG. 2. The width and interval of the Cu wiring patterns 23P1 and 23P2 were the same as those used in the standard device illustrated in FIG. 2.

"(b) EMBODIMENT 2" in FIG. 7 indicates the result obtained using Embodiment 2, which will be described later.

In this test summarized in FIG. 7, a voltage of 30 V was applied between adjacent Cu wiring patterns of each device at a temperature of 150° C. and the time to dielectric breakdown was measured.

The TDDB values on the vertical axis of FIG. 7 have been normalized with respect to the value for the standard device shown in "(d) CONVENTIONAL ART." As is obvious from the graph, the TDDB value of the other standard device shown on "(c) WITHOUT Mn" is almost equal to that shown in "(d) CONVENTIONAL ART." This means that the carbon-including film 24 itself has little or no ability to prevent diffusion of Cu atoms.

On the other hand, the TDDB value of the device corresponding to Embodiment 1 and shown in "(a) EMBODIMENT 1" is more than 12 times higher than that of the standard device tested as a control.

Therefore, it may be said that, among others, the manganese oxide film 23MOx including carbon exhibits especially high performance in preventing diffusion of Cu atoms and that the semiconductor device 40 configured according to Embodiment 1 so as to have such a manganese oxide film 23MOx and the equivalents thereof, i.e., manganese oxide films 26MOx and 29MOx, acquires a long service life.

FIGS. 9A to 9K are diagrams illustrating a manufacturing process of a semiconductor device according to Embodiment 2. It should be noted that the components in FIGS. 9A to 9K that have already been described above are numbered with the reference numerals used in the previous explanation to avoid repetition.

Figure 9A:
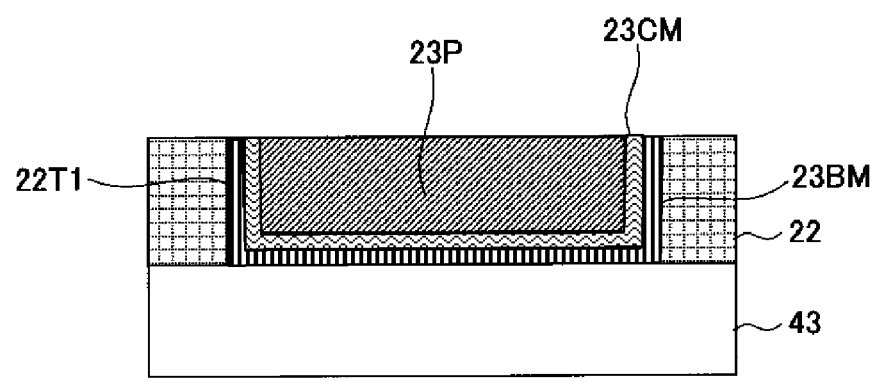
FIGS. 9A-9K are diagrams illustrating a manufacturing process of a semiconductor device according to Embodiment 2.

FIG. 9A corresponds to the structure shown in FIG. 5D with the exception that the interlayer insulating film 22 is a low-dielectric-constant $SiO_2$ film resistant to etching of a hydrocarbon polymer film, such as an MSQ film.

Figure 9B:
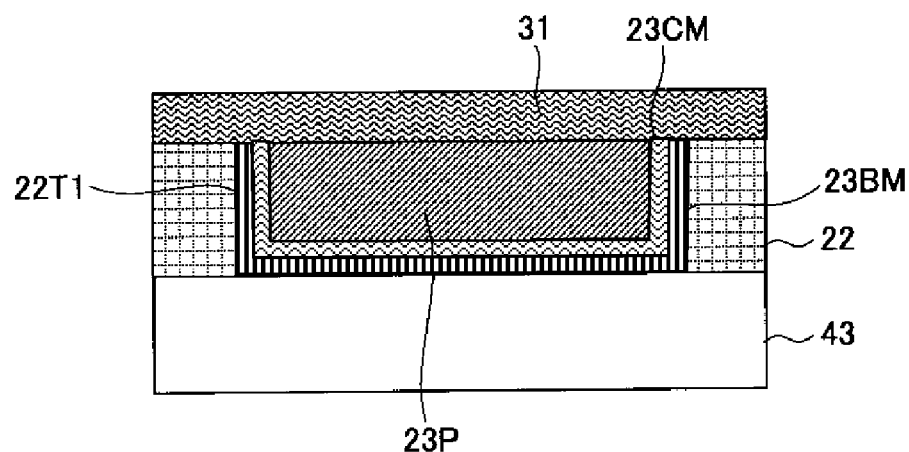
Figure 9C:
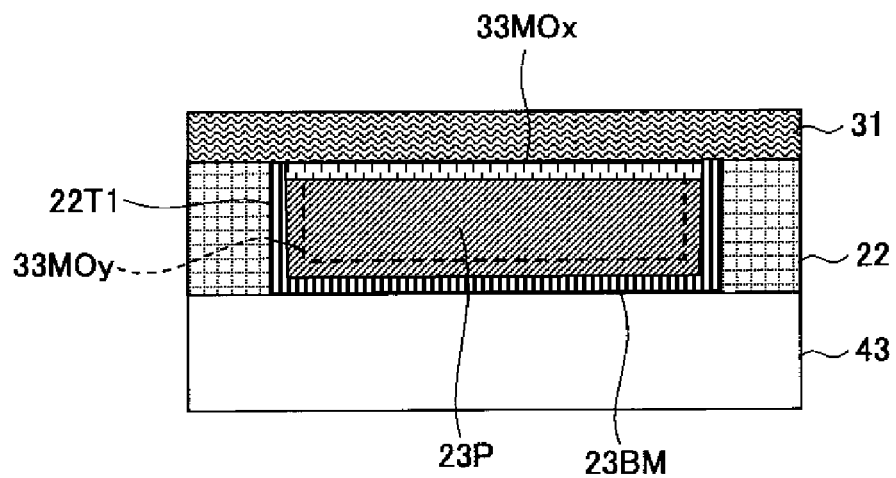

In Embodiment 2, as shown in FIG. 9B, a carbon-including film 31 is formed on the structure illustrated by FIG. 9A so as to cover the top of the interlayer insulating film 22 and that of the Cu wiring pattern 23P. This carbon-including film 31 is, for example, a hydrocarbon polymer film commercially available under the name of SiLK (registered trademarks of The Dow Chemical Company) or a similar film that includes carbon (C) and oxygen, is resistant to heat treatment at a temperature in the range of 350 to 400° C., and allows selective etching of the interlayer insulating film 22 existing therebeneath.

Then, the structure shown in FIG. 9B is heated at a temperature in the range of 350 to 400° C. under inert atmosphere or, more typically, nitrogen atmosphere. Thereafter, a manganese oxide film 33MOx whose composition is represented using composition parameters s and t ($MnO_sC_t$) is formed so as to cover the top of the Cu wiring pattern 23P while spreading along the hydrocarbon polymer film 31. More specifically, the manganese oxide film 33MOx is formed from Mn atoms initially included in the Cu—Mn alloy layer 23CM and oxygen and carbon atoms supplied by the hydrocarbon polymer film 31 through the reaction thereof so as to have a thickness in the range of 1 nm to 5 nm. The composition parameters s and t of the manganese oxide film 33MOx formed in this way are 0.75 to 3.0 and 0.2 to 0.7, respectively.

Furthermore, oxygen atoms that are released from the interlayer insulating film 22 penetrate through the barrier metal film 23BM into the Cu wiring pattern 23P and then react with Mn atoms existing in the Cu—Mn alloy layer 23CM, thereby producing a manganese oxide film 33MOy spreading between the Cu wiring pattern 23P and the barrier metal film 23BM. This manganese oxide film 33MOy has a composition represented using composition parameters u and v ($MnO_uC_v$) wherein the composition parameter v is zero or any number less than t (v<t).

Figure 9D:
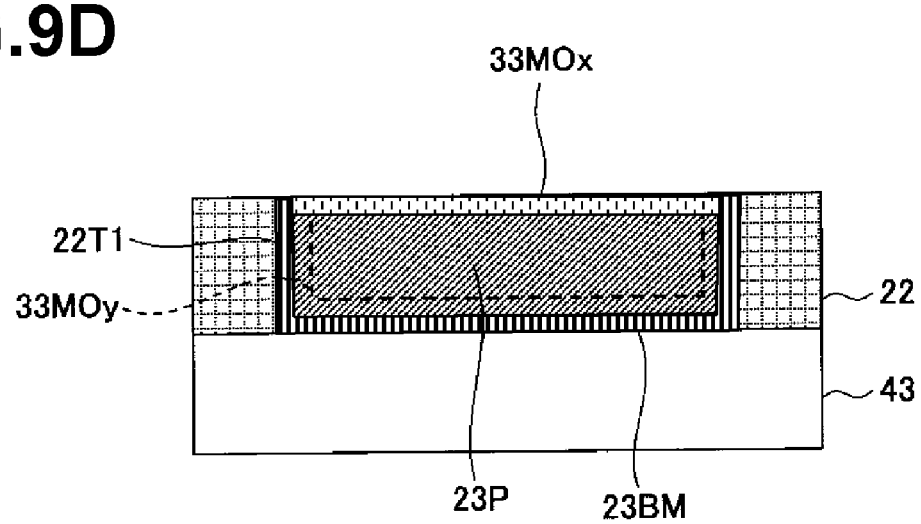

Embodiment 2 further involves the step shown in FIG. 9D, wherein the carbon-including film 31 was removed through the process of selective etching or ashing so as to expose the interlayer insulating film 22 and the manganese oxide film 33MOx preferentially.

Figure 9E:
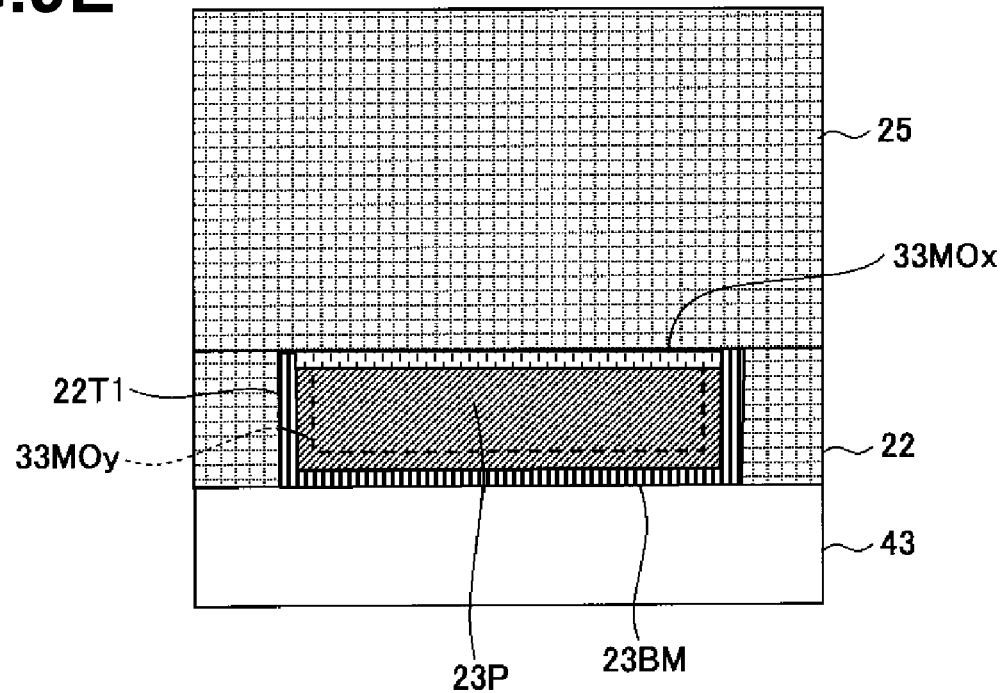

Subsequently, as shown in FIG. 9E, the structure illustrated by FIG. 9D is covered with the next interlayer insulating film 25 consisting of an MSQ film or a similar silicon oxide film. After that, a wiring trench 25T1 and a via hole 25V1 are carved through the interlayer insulating film 25 so that the Cu wiring pattern 23P is exposed, as shown in FIG. 9F.

Figure 9F:
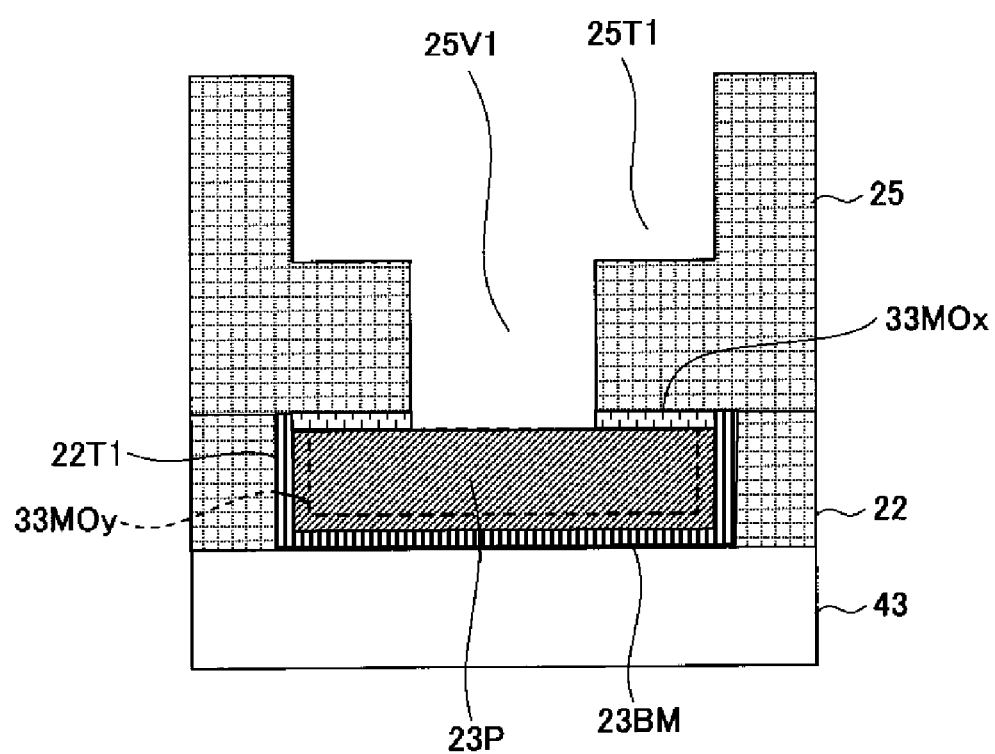
Figure 9G:
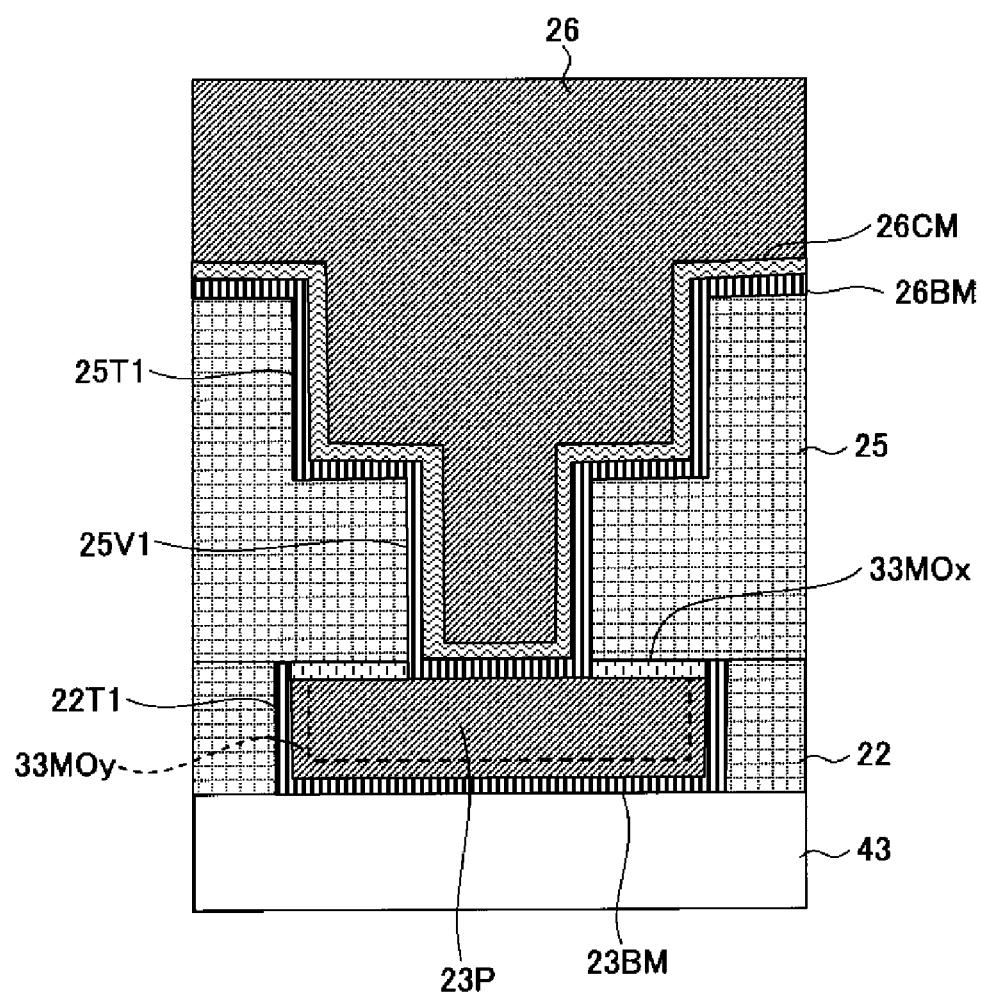

Furthermore, as shown in FIG. 9G, the interlayer insulating film 25 seen in FIG. 9F is coated with the barrier metal film 26BM and then with the Cu—Mn alloy film 26CM in the same manner as the step described using FIG. 5H so that the coating layers have the cross-sectional shape fitting the wiring trench 2ST1.

FIG. 9G also includes a Cu layer 26, which is formed on the Cu—Mn alloy layer 26CM by seed layer formation and electrolytic plating so as to fill the wiring trench 25T1 and the via hole 25V1.

Figure 9H:
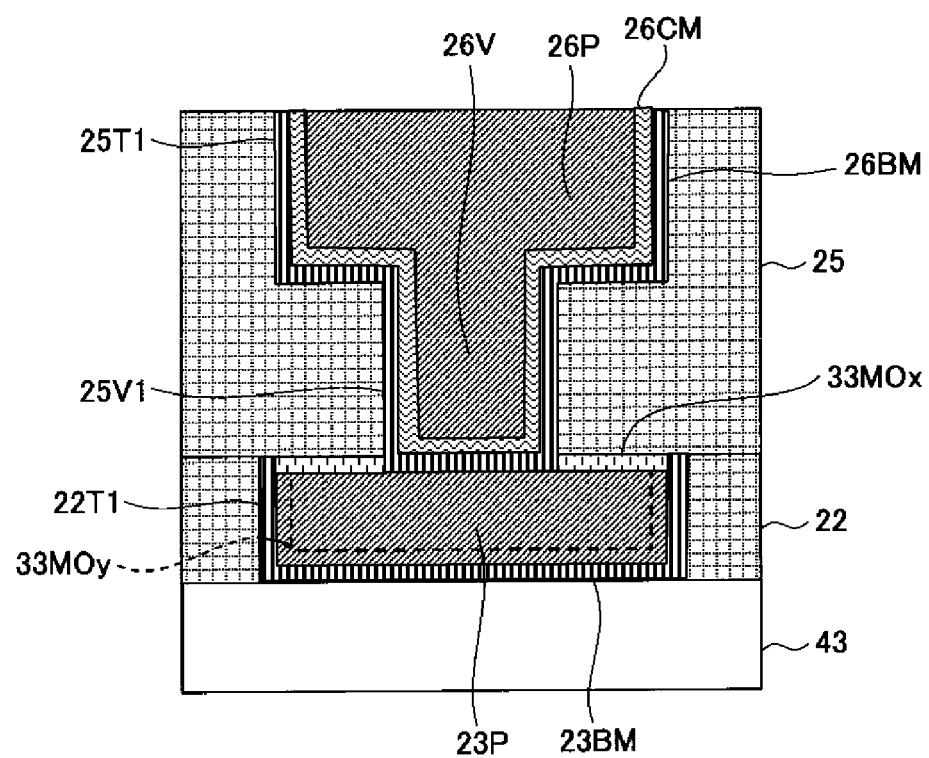

Thereafter, as shown in FIG. 9H, the Cu layer 26, and the Cu—Mn alloy layer 26CM and the barrier metal layer 26BM formed therebeneath are shaved by CMP until the surface of the interlayer insulating film 25 is exposed. This results in the formation of the Cu wiring pattern 26P in the wiring trench 25T1 and, although not shown in the drawing, the Cu wiring patterns 26Q and 26R in the wiring trenches 25T2 and 25T3, respectively.

Figure 9I:
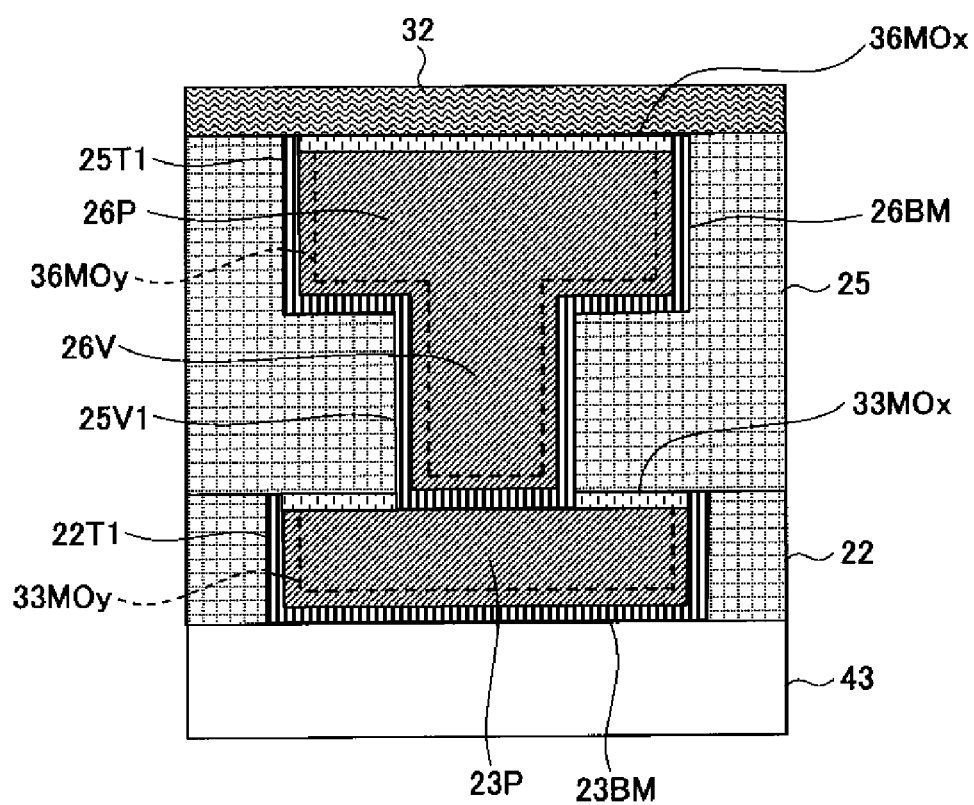

In this embodiment, the structure obtained in FIG. 9H is then coated with the carbon-including film 32 having the same composition as the carbon-including film 31 and a thickness in the range of 15 nm to 30 nm as shown in FIG. 9I, and then this structure is heated at a temperature in the range of 350 to 400° C. This heat treatment makes Mn atoms existing in the Cu—Mn alloy layer 26CM move to the surface of the Cu wiring pattern 26P and react with carbon and oxygen atoms supplied by the carbon-including film 32 there as described earlier using FIG. 6. As a result, a manganese oxide film 36MOx having a composition of $MnO_sC_t$ described earlier is formed on the surface of the Cu wiring pattern 26P while spreading along the carbon-including film 32, in the same manner as the manganese oxide film 33MOx.

The step represented by FIG. 9I also involves transportation of a small number of oxygen atoms from the interlayer insulating film 25 through the barrier metal film 26BM to the Cu wiring pattern 26P during the heat treatment. As described earlier using FIG. 6, such oxygen atoms react with some of Mn atoms initially included in the Cu—Mn alloy layer 26CM, thereby producing another manganese oxide film 36MOy between the barrier metal film 26BM and the Cu wiring pattern 26P (via plug 26V) in the same manner as the manganese oxide film 33MOy. This manganese oxide film 36MOy includes no carbon or carbon at any concentration lower than that in the manganese oxide film 36MOx.

Also in this case, the original Cu—Mn alloy layer 26CM is reduced as such manganese oxide films 36MOx and 36MOy are formed and finally disappears at the end of the step represented by FIG. 9I.

Figure 9J:
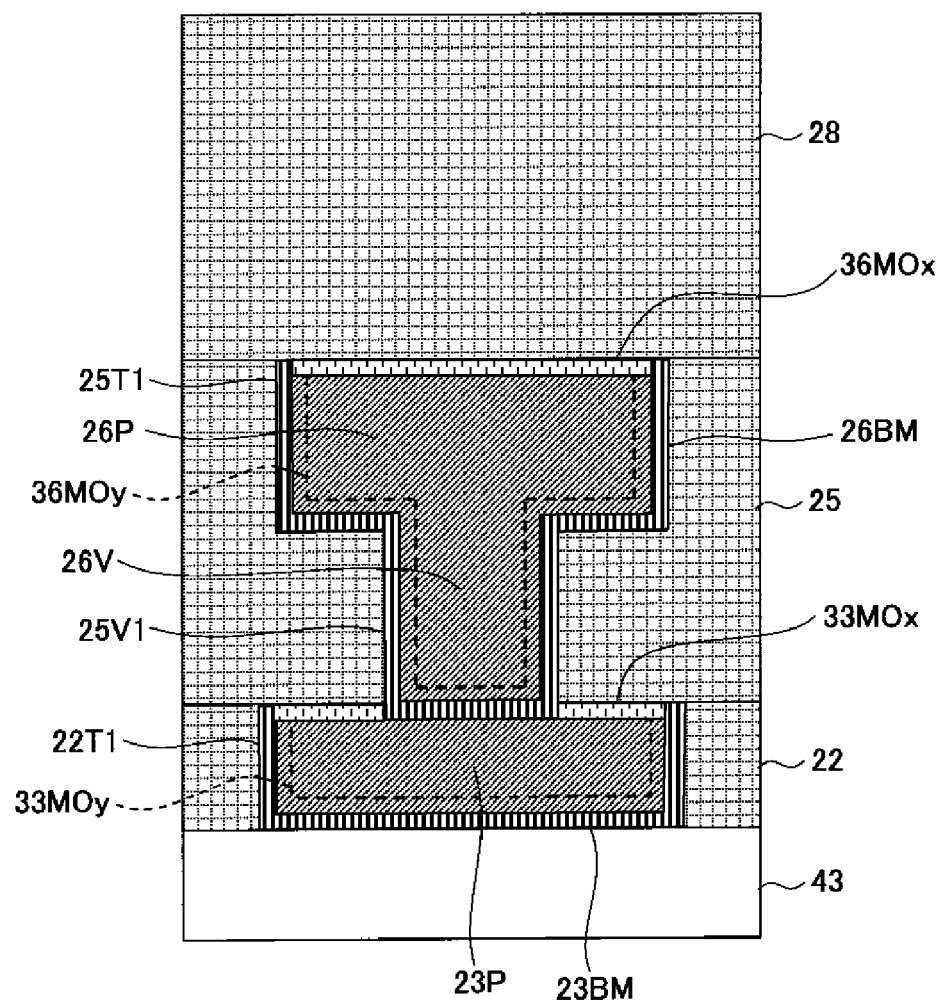
Figure 9K:
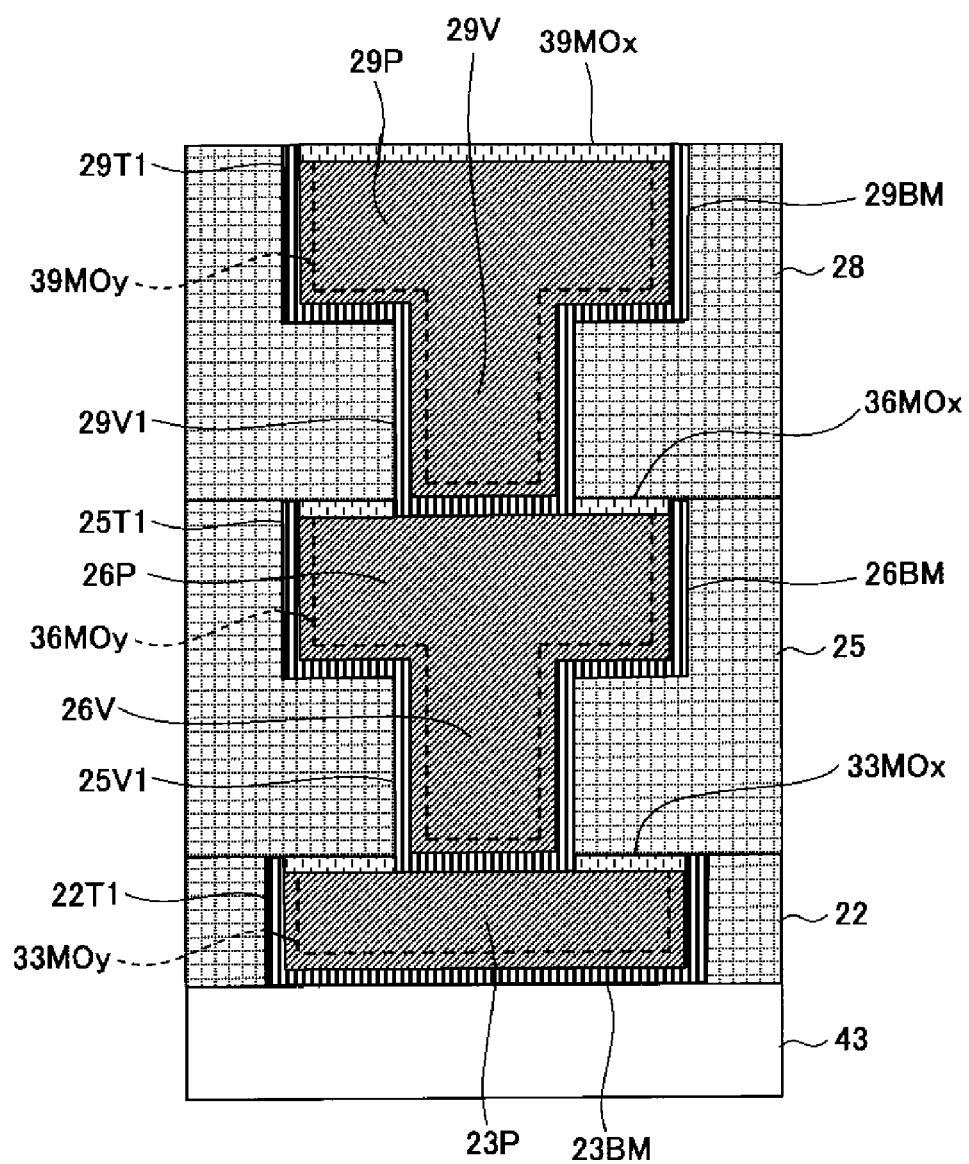

In the next step shown in FIG. 9J, the structure illustrated by FIG. 9I is covered with the interlayer insulating film 28 formed in the same manner as the interlayer insulating films 22 and 25. Then, the steps shown in FIGS. 9E to 9I are repeated to carve the wiring trench 28T1 through the interlayer insulating film 28, to cover the wiring trench 28T1 with the barrier metal film 29BM, and then to fill the wiring trench 28T1 with the Cu wiring pattern 29P. After that, in the upper part of the Cu wiring pattern 29P, an additional carbon-including insulating film is formed in the same manner as the carbon-including film 30, and the manganese oxide film 39MOx is formed in the same manner as the manganese oxide films 33MOx and 36MOx along the additional carbon-including film. Between the Cu wiring pattern 29P and the barrier metal film 29BM, the manganese oxide film 39MOy is formed in the same manner as the manganese oxide films 33MOy and 36MOy. It should be noted that FIG. 9K represents the structure obtained by removing the additional carbon-including insulating film after the process described above.

Figure 10:
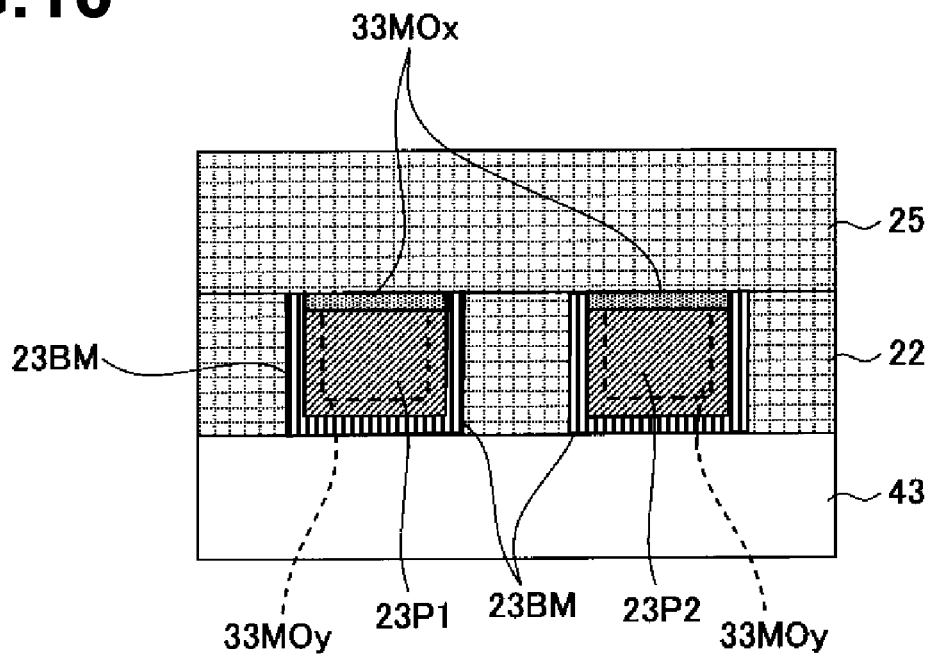
FIG. 10 is a diagram illustrating a configuration of a device used to demonstrate the advantageous effect of Embodiment 2.

The result of the TDDB test conducted using the multilayer wiring structure prepared in accordance with Embodiment 2 is also shown in FIG. 7 as "(b) EMBODIMENT 2." This test involved a semiconductor device equivalent to that shown in FIG. 8B with exceptions that the interlayer insulating film 25 was formed directly on the interlayer insulating film 22 and that the manganese oxide films 33MOx and 33MOy were used instead of the manganese oxide films 23MOx and 23MOy as shown in FIG. 10. This device also employed an interval of 70 nm between adjacent Cu wiring patterns as well as the other tested devices.

As clearly seen in FIG. 7, the TDDB value of the device corresponding to Embodiment 2 is also more than 12 times higher than that of the standard device tested as a control.

Figure 11:
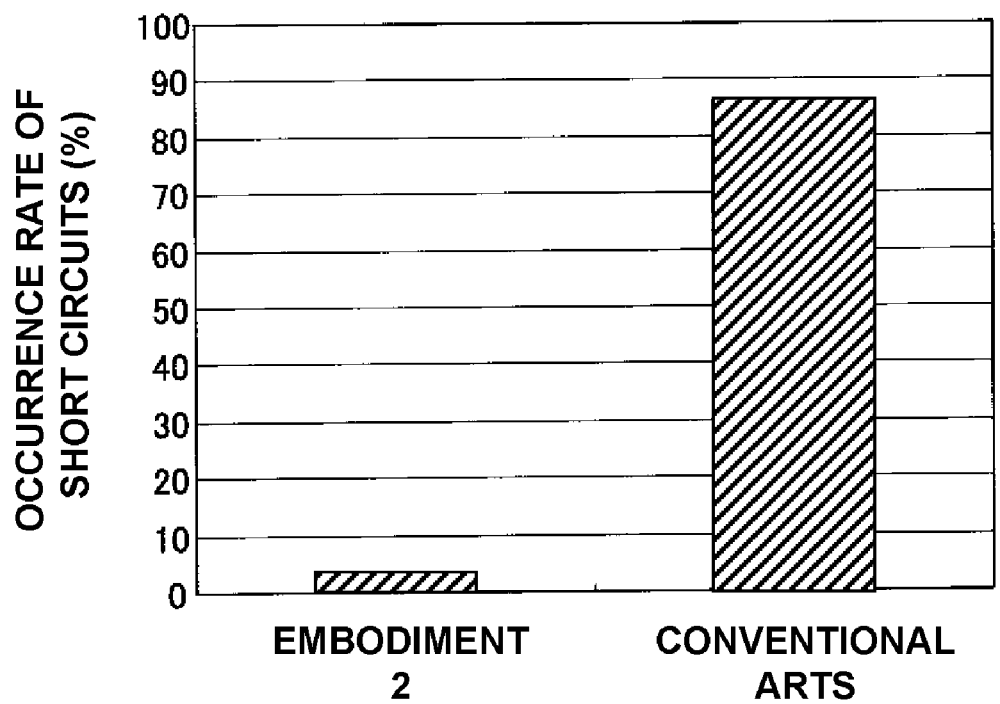
FIG. 11 is an additional diagram demonstrating the advantageous effect of Embodiment 2.
Figure 12:
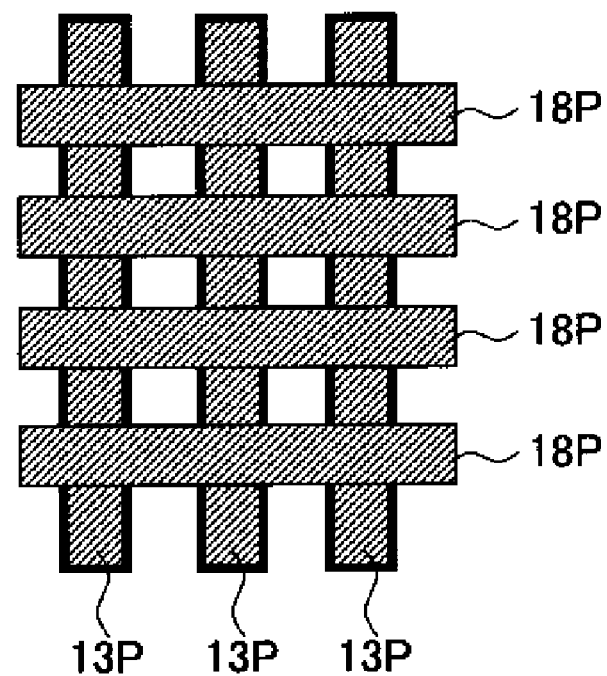
FIG. 12 is a diagram illustrating a configuration of a device used to demonstrate the advantageous effect of Embodiment 2.

Meanwhile, FIG. 11 represents the result of short-circuit study, wherein a test structure in which upper Cu wiring patterns 18P extend while crossing over the lower Cu wiring patterns 13P, like one described earlier using FIG. 3F, was prepared through the steps shown in FIGS. 9A to 9K and then occurrences of short circuits between the upper and lower Cu wiring patterns were monitored. As shown in FIG. 12, this test structure includes the lower Cu wiring patterns 13P and the upper Cu wiring patterns 18P arranged so as to be perpendicular to each other, and the interval between adjacent Cu wiring patterns was set at 70 nm for both upper and lower patterns. In addition, the structure used in this test was configured without the via plugs 26V and 29V.

As seen in FIG. 11, the occurrence rate of short circuits was approximately in the range of 2 to 3% in the semiconductor device prepared in accordance with Embodiment 2, whereas the occurrence rate of short circuits was higher than 85% in the standard device as a control prepared in the steps shown in FIGS. 3A to 3F. In this standard device prepared in the steps shown in FIGS. 3A to 3F, the diffusion barrier film 16 had a bump with a height of 30 nm due to the Cu wiring pattern 13P and the height of the interlayer insulating film 17 was 300 nm.

The result shown in FIG. 11 probably reflects the fact that the present embodiment employs a lower interlayer insulating film 22 and a manganese oxide film 33MOx both resistant to etching and thus no bump is formed after the hydrocarbon polymer film 31 is removed by dry etching or ashing in the step shown in FIG. 9D.

Meanwhile, in the present embodiment, the interlayer insulating films 22, 25, and 28 do not always have to consist of an MSQ film. Although having a higher dielectric constant, a silicon oxide film produced by plasma CVD of tetraethoxysilane (TEOS) may also be used depending on the intended application.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modification and equivalents may be resorted to, falling within the scope thereof.

The invention claimed is:

1. A semiconductor device comprising:
   a first insulating film formed over a semiconductor substrate;
   a first opening formed in the first insulating film;
   a first manganese oxide film formed along an inner wall of the first opening;
   a first copper wiring formed in the first opening;
   a second manganese oxide film formed on the first copper wiring including carbon;
   a second insulating film formed over the first insulating film and the second manganese oxide film;
   a second opening formed in the second insulating film;
   a second copper wiring formed in the second opening; and
   a high-melting-point metal film formed along an inner wall of each of the first opening and the second opening;
   wherein a portion of the second manganese oxide film is removed to make an electric contact between the first copper wiring and the second copper wiring.

2. The semiconductor device according to claim 1, further comprising a second insulating film formed over the second manganese oxide film.

3. The semiconductor device according to claim 1, further comprising a silicon carbide insulating film formed over the second manganese oxide film.

4. The semiconductor device according to claim 1, wherein the first manganese oxide film includes carbon at a lower concentration than a concentration of carbon in the second manganese oxide film.

5. The semiconductor device according to claim 1, wherein the first manganese oxide film includes no carbon.

* * * * *